United States Patent [19]
Sekiguchi et al.

[11] Patent Number: 5,910,911
[45] Date of Patent: Jun. 8, 1999

[54] SEMICONDUCTOR MEMORY AND PROCESS OF OPERATING THE SAME

[75] Inventors: Tomonori Sekiguchi, Kokubunji; Hiroki Fujisawa, Ome; Takeshi Sakata, Kodaira; Takayuki Kawahara, Higashi-yamato; Katsutaka Kimura, Akishima, all of Japan

[73] Assignee: Hitachi, Ltd., Tokyo, Japan

[21] Appl. No.: 08/774,907

[22] Filed: Dec. 27, 1996

[30] Foreign Application Priority Data

Dec. 27, 1995 [JP] Japan ................................. 7-340366

[51] Int. Cl.$^6$ .......................................... G11C 11/22
[52] U.S. Cl. ........................................ 365/145; 365/150
[58] Field of Search .............................. 365/145, 149, 365/150, 189.05, 230.09

[56] References Cited

U.S. PATENT DOCUMENTS 5,737,260 4/1998 Takata ........................................ 365/145

Primary Examiner—Terrell W. Fears
Attorney, Agent, or Firm—Antonelli, Terry, Stout & Kraus, LLP

[57] ABSTRACT

Disclosed is a semiconductor memory having memory cells, each containing a selection transistor and a capacitor using a ferroelectric film, which memory can be operated in both volatile and nonvolatile modes (e.g., a shadow RAM). A common plate electrode is used for the capacitors of the plurality of memory cells, and this common plate electrode is held at a fixed (constant) voltage. The memory has two data lines for each memory cell, and a sense amplifier connected between the two data lines. Volatile or nonvolatile operation is established depending on the voltage applied to the amplifier. The voltage applied to the amplifier is increased and the ferroelectric capacitor is completely polarized to write nonvolatile information; to write volatile information, this voltage is decreased and polarization reversal is minimized. The memory can have a mode switching circuit which changes the power supply voltage to the amplifier, to change mode of operation between volatile and nonvolatile modes, and an internal voltage generator to generate voltages, inter alia, for read and write in both the volatile and nonvolatile modes of operation. The memory performs store and recall operations at a high speed and decreased power consumption; and fatigue of the ferroelectric capacitor when performing volatile write decreases, and the number of rewritings can be increased.

45 Claims, 22 Drawing Sheets

Nonvolatile : Vpl
Volatile : Vpl

Shadow RAM chip

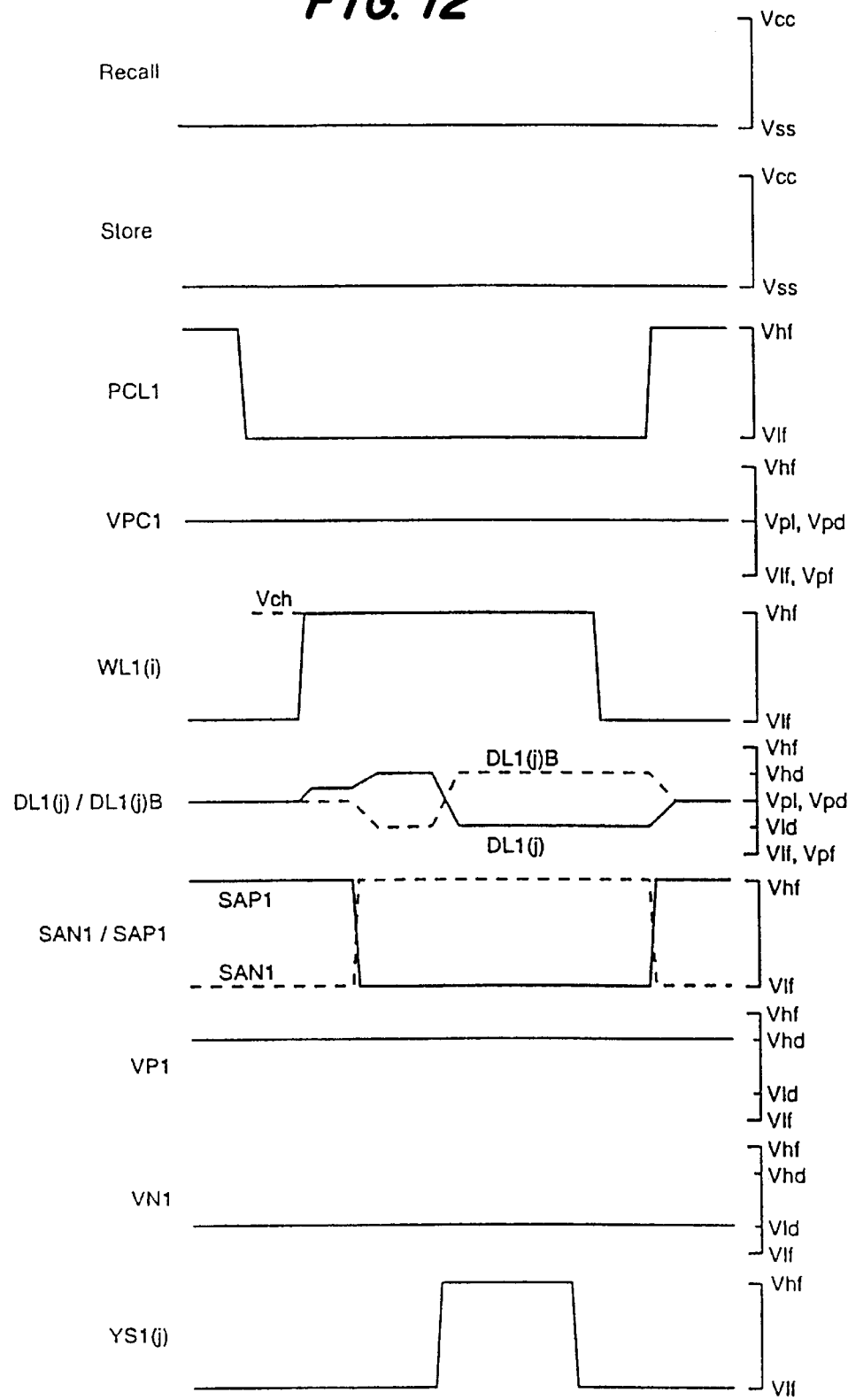

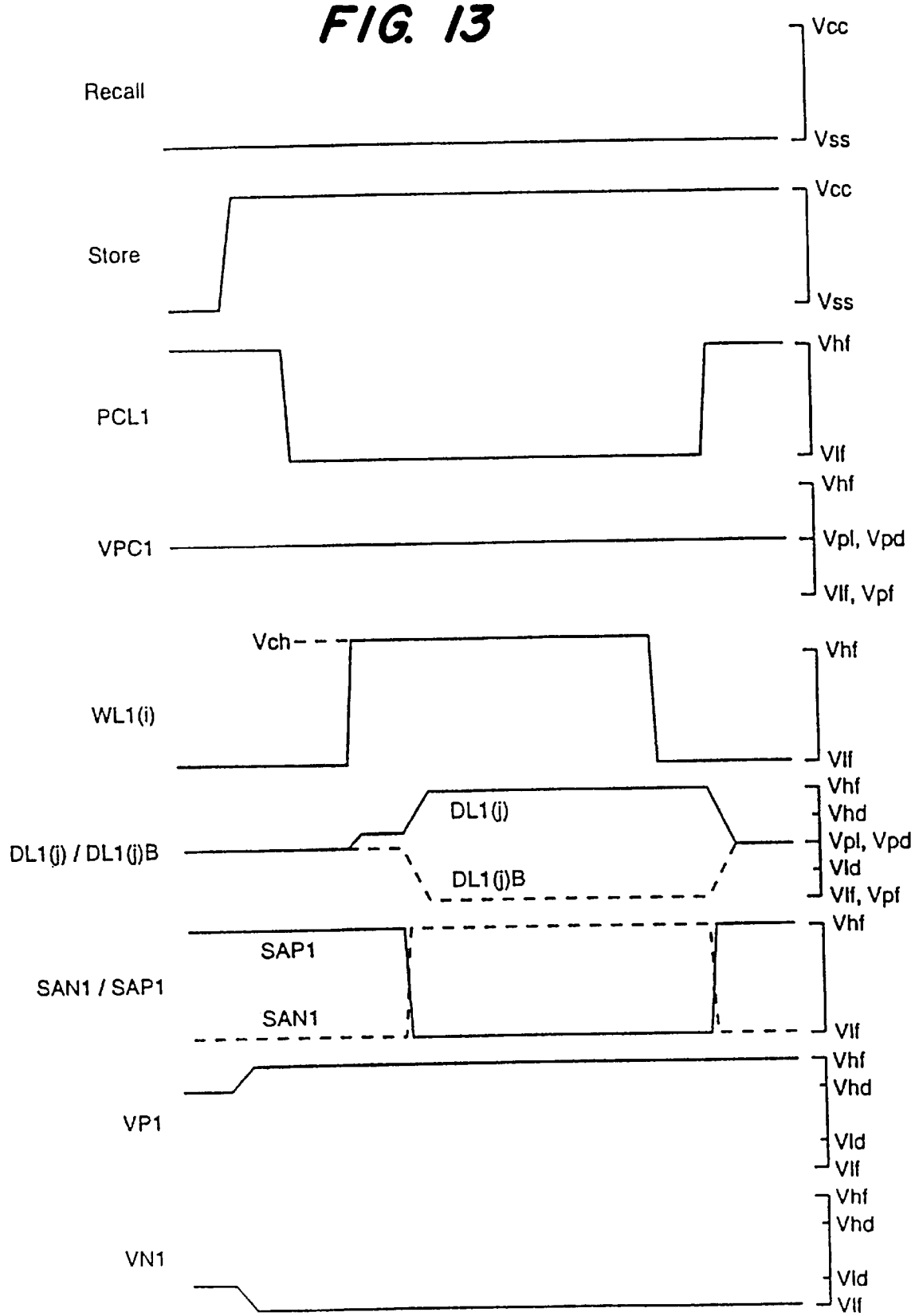

Nonvolatile: Vpl

Volatile : Vpl

Nonvolatile: Vcc/2
Volatile: Vss

Nonvolatile: Vcc pulse

Volatile: Vcc/2

Nonvolatile: Vcc/2

Volatile: Vcc/2

SEMICONDUCTOR MEMORY AND PROCESS OF OPERATING THE SAME

BACKGROUND OF THE INVENTION

The present invention relates to a nonvolatile memory. In particular, the present invention relates to a ferroelectric memory that can act both as a volatile memory and as a nonvolatile memory.

A ferroelectric memory is a memory simultaneously realizing random access and nonvolatile storing by integrating a semiconductor device and a ferroelectric capacitor. Moreover, because the structure and operation principle of the ferroelectric memory are similar to those of a DRAM (dynamic random access memory), it is considered that an integration degree and an operation speed almost equal to those of the DRAM can be realized.

The ferroelectric memory stores information in the direction of remanent polarization of the ferroelectric capacitor. Therefore, the ferroelectric capacitor has a problem of fatigue. The magnitude of the remanent polarization of the ferroelectric capacitor decreases after repeating polarization reversal $10^{10}$ to $10^{12}$ times. Due thereto, the intensity of the signal for reading information is decreased and it is difficult to stably operate the memory. Therefore, the life of the ferroelectric memory is limited by the polarization reversal frequency of the ferroelectric capacitor.

The degree of the fatigue depends on the materials of the ferroelectric film and of the electrodes. For example, as shown in the *Japanese Journal of Applied Physics*, Vol. 34 (1995) pp. 5233–5239, the value of remanent polarization of a ferroelectric film made of PZT (lead zirconate-titanate) is larger than that of a ferroelectric film made of $SrBi_2Ta_2O_9$, but the fatigue of the latter is smaller than that of the former. For example, as shown in *Integrated Ferroelectrics*, Vol. 3 (1993), pp. 365–376, the fatigue of an electrode made of ruthenium oxide is smaller than that of an electrode made of Pt even when the ferroelectric film is made of PZT.

To solve the problem of the shortening of the life due to fatigue, a ferroelectric memory called a shadow RAM has been proposed so far. The shadow RAM stores positive or negative electric charges (volatile information) accumulated in a capacitor in normal operation similarly to a DRAM and simultaneously converts the information into the polarization direction (nonvolatile information) when turning off the power supply (store operation). When turning on the power supply, the shadow RAM converts the nonvolatile information into volatile information (recall operation). Because it is possible to read or write the volatile information without causing polarization reversal, this method makes it possible to decrease the polarization reversal frequency of the ferroelectric capacitor and prolong the life.

Conventional example 1 of a shadow RAM is disclosed in Japanese Patent Laid-Open No. 283176/1991. FIG. 21(a) of the present application shows a memory cell of this shadow RAM. The shadow RAM is constituted by arranging a plurality of such memory cells in an array. One electrode PL of a ferroelectric capacitor C is connected in common with the ferroelectric capacitors of other memory cells. The other electrode SN of C is connected with the source electrode of a MOS transistor MN. The drain of MN is connected to a data line DL. The gate electrode of MN is connected to a word line WL.

In the volatile mode, PL is set to Vss. To write information, WL is set to Vch, MN is turned on, DL is set to Vcc or Vss in accordance with whether the information to be stored is "0" or "1", and, thereby, WL is lowered to Vss to accumulate electric charge in C. In this case, Vss denotes a ground potential, Vcc denotes a power supply potential, and Vch denotes a potential higher than Vcc. To read information, DL is pre-charged to Vcc/2, and thereafter WL is raised up to Vch to detect the polarity of the electric charge flowing into the data line, from the capacitor, by a sense amplifier.

These states are shown by the hysteresis curve showing the state of a ferroelectric capacitor in FIG. 21(b). The potential of SN is V(SN) and that of PL is V(PL). The graph shows the voltage V(SN)–V(PL) applied to the ferroelectric capacitor as the abscissa, and the electric charge Q, which is a value obtained by multiplying the polarization of the capacitor by the area of the capacitor, as the ordinate. To reverse the polarization of the ferroelectric capacitor, defining the minimum voltage to be applied to both ends of the capacitor as the coercive voltage Vc, the circuit is designed so that Vc is smaller than Vcc/2. Because PL is set to Vss, the value Q is D1 when "1" of the volatile information is stored and Do when "0" of the volatile information is stored. The polarization is not reversed because only a positive voltage is applied to the capacitor during volatile operation.

In the nonvolatile mode, PL is set to Vcc/2. To write information, WL is raised to Vch and DL is set to Vcc or Vss in accordance with "1" or "0" of information to be stored. The states on the hysteresis curve at this stage are located at B1 and B0. Finally, DL is returned to Vcc/2 and then WL is lowered to Vss. The state of the capacitor changes from B1 to F1 or from B0 to F0. That is, in the nonvolatile mode, polarization reversal occurs because a positive or negative voltage is applied to the capacitor. To read the direction of polarization, DL is pre-charged to Vss and WL is raised up to Vch to detect presence or absence of a polarization reversal current by a sense amplifier. Therefore, polarization is reversed even at the time of read.

Conventional example 2 of a shadow RAM, which is disclosed in Japanese Patent Laid-Open No. 5996/1991, will be described in the following. FIG. 22(a) shows a memory cell of this shadow RAM and FIG. 22(b) shows the state on a hysteresis loop. In this example, design is so made as to meet Vcc/2<Vc<Vcc.

In the volatile mode, PL is set to Vcc/2. To write information, WL is set to Vch to turn on MN, DL is set to Vcc or Vss and thereby WL is lowered to Vss to accumulate electric charge in C. Because PL is Vcc/2 on the hysteresis curve, the state is located at the position D1 when volatile information "1" is stored, and at the position D0 when volatile information "0" is stored. Though a positive or negative voltage is applied to the capacitor during write or read operation, polarization is not reversed theoretically because Vc is higher than Vcc/2. However, a small polarization reversal normally occurs as shown in FIG. 22(b).

In the nonvolatile mode, information is written by driving PL. DL is set to Vcc or Vss in accordance with "1" or "0" of the information to be written, and then WL is raised up to Vch. Then, PL is raised from Vss up to Vcc and returned to Vss again to cause polarization reversal. Finally, DL is returned to Vss and thereafter WL is lowered to Vss. By this operation, the state shifts to F1 after passing B1 and shifts to F0 after passing B0 on the hysteresis curve. That is, because a sufficiently high positive or negative voltage is applied to the capacitor by driving PL, polarization reversal occurs. To read information, PL is lowered to Vss, DL is precharged up to Vcc, and WL is raised up to Vch to detect the presence or absence of a polarization reversal current by a sense amplifier. Therefore, polarization is reversed also to read information.

Finally, conventional example 3 of a RAM whose operation is similar to a shadow RAM, disclosed in Japanese Patent Laid-Open No. 21784/1995, will be described below. FIG. 23(a) shows a memory cell of this RAM and FIG. 23(b) shows the state of a hysteresis loop. In this example, design is so made as to meet Vc<Vcc/2.

In this example, PL is set to Vcc/2 both in the volatile and nonvolatile modes. To write volatile information, WL is set to Vch to turn on MN, DL is set to Vcc or Vss, and, then, WL is lowered to Vss to accumulate electric charge in C. Because PL is Vcc/2 on the hysteresis curve, the state is located at the position D1 when volatile information "1" is stored and at the position of D0 when volatile information "0" is stored. Because a positive or negative voltage is applied to the capacitor and the critical voltage Vc is lower than Vcc/2, polarization reversal occurs. That is, volatile write simultaneously causes nonvolatile write and the polarity of electric charge always corresponds to the direction of polarization. At the time of volatile read, only electric charge is read. DL is pre-charged up to Vcc/2, and, thereafter, WL is raised up to Vch to detect the polarity of the electric charge flowing into a data line from the capacitor. Therefore, polarization reversal does not occur at the time of read.

In the nonvolatile mode, polarization is read. DL is precharged up to Vss, and, thereafter, WL is raised up to Vch to detect the presence or absence of a polarization reversal current by a sense amplifier. Therefore, the polarization is reversed at the time of nonvolatile read.

In the case of conventional example 1, the potential of plate electrode PL is changed for volatile operation and nonvolatile operation. Therefore, it is necessary to change the plate potential during the store operation when turning off the power supply. PL is first set to Vss when reading the volatile information and it is raised up to Vcc/2 after sensing a signal to write the volatile information as nonvolatile information. This store operation is simultaneously performed for memory cells connected to one word line. Therefore, to perform a store operation for all memory cells, it is necessary to select all word lines in order and repeat the operation for changing the plate potential each time. Also for the recall operation, the same PL control is necessary. PL has a large parasitic capacitance because it is common to all memory cells. Therefore, it is difficult to perform the store operation and the recall operation at a high speed, and, moreover, power consumption increases.

In conventional example 2 PL is pulse-driven during the nonvolatile operation. Therefore, because PL is divided in the word-line direction, this brings about a problem that the area of the memory cell increases. Moreover, it is difficult to increase the operating speed because it is necessary to time the driving of PL, though the parasitic capacitance of PL is smaller than that of conventional example 1.

Therefore, the method of changing the volatile operation mode and the nonvolatile operation mode by the plate potential or its driving method has problems that the chip area increases, the store or recall operation speed decreases, and the power consumption increases. In the case of conventional example 3, these problems are solved by setting PL to Vcc/2 for both nonvolatile operation and volatile operation. However, conventional example 3 has a problem that the write frequency is limited because polarization reversal occurs during volatile write. A problem to be solved by the present invention is to realize a shadow RAM causing no polarization reversal during volatile operation without changing the potential of the plate electrode PL during volatile and nonvolatile operations.

In the case of conventional examples 1 and 2, because the store operation is complex, it is difficult to completely perform the store operation when the power supply is suddenly turned off due to a problem in the system in which a ferroelectric memory is installed. Therefore, in the case of conventional examples 1 and 2, information may be lost when the power supply is turned off without performing the store operation, because remanent polarization is uniformly directed in a certain direction and no nonvolatile information is stored. However, conventional example 3 realizes one method for solving the above problem because volatile information and nonvolatile information are written at the same time, and, therefore, the information when the power supply is turned off without performing the store operation remains as nonvolatile information. Another problem to be solved by the present invention is to store nonvolatile information independently of volatile information by reading or writing volatile information without changing nonvolatile information.

A third problem to be solved by the present invention is to effectively use to advantage the fact that even a capacitor using PZT for a ferroelectric film and Pt for an electrode has a large remanent polarization by improving the operation method and reducing the fatigue.

SUMMARY OF THE INVENTION

Accordingly, it is a first object of the present invention, to provide a semiconductor device, e.g., a semiconductor memory, such as a shadow RAM, providing both volatile and nonvolatile mode operations, using a capacitor having a ferroelectric film, wherein in the volatile mode operation there is no polarization reversal of the ferroelectric film, and a plate potential of the plate electrode PL of the capacitor is unchanged during volatile and nonvolatile operation; and to provide a method of operating such semiconductor device.

It is a further object of the present invention to provide a semiconductor device, including a ferroelectric memory such as the aforementioned shadow RAM, which can store nonvolatile information independently of volatile information, by reading and/or writing volatile information without changing nonvolatile information; and to provide a method of operating such a semiconductor device.

It is a still further object of the present invention to provide a semiconductor device, such as a shadow RAM, having a capacitor using a ferroelectric film, which exhibits reduced fatigue, and a method of operating such semiconductor device.

The foregoing objects are achieved, and the above problems solved, wherein, in a nonvolatile memory of the present invention, one of nonvolatile information write (the data-line amplitude thereof having a first voltage) and volatile information write (the data-line amplitude thereof having a second voltage lower than the first voltage) is selected in accordance with the data-line amplitude during a write operation. In this case, the plate potential (first potential) is always kept constant. That is, to write nonvolatile information, the amplitude of the data line is increased to completely polarize the ferroelectric capacitor. However, to write volatile information, the amplitude of the data line is decreased to minimize polarization reversal. Thus, according to this aspect of the present invention, a constant potential is applied to the plate electrode of the capacitor, which is a common electrode for the capacitors of a plurality of memory cells, and volatile or nonvolatile mode operation is selected by the data-line amplitude. When using the present nonvolatile memory, volatile write and volatile read are normally performed to reduce its fatigue. By performing nonvolatile write when turning off the power supply and nonvolatile read when turning on the power supply, nonvolatile storing is performed only while the power supply is off. Thereby, the remaining problems are solved.

To store nonvolatile information independently of volatile information, and defining the minimum voltage to be applied to both ends of the ferroelectric capacitor in order to polarize the capacitor as coercive voltage Vc, the voltage applied to the capacitor when writing or reading volatile information is made lower than Vc. That is, when writing or reading volatile information, no polarization reversal occurs or no nonvolatile information changes. Moreover, periodically volatile information is read and the information is written with a large amplitude to copy the volatile information to nonvolatile information.

BRIEF DESCRIPTION OF THE DRAWINGS

FIG. 12 is a timing chart of the volatile write operation of embodiment 1;

FIG. 13 is a timing chart of the store operation of embodiment 1;

DETAILED DESCRIPTION OF THE INVENTION

Figure 1A:
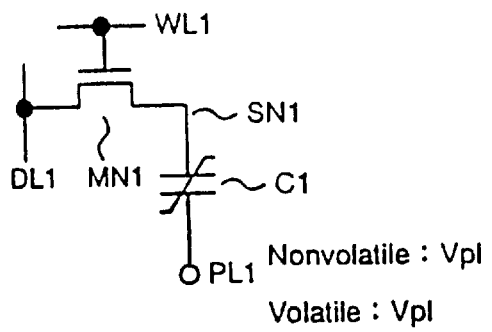
FIG. 1(a) shows a memory cell of a first embodiment of the present invention.

While the present invention will be described in connection with specific and preferred embodiments, it will be understood that it is not intended to limit the invention to those embodiments. To the contrary, it is intended to cover all alterations, modifications and equivalents as may be included within the spirit and scope of the invention as defined by the appended claims.

Throughout the present disclosure, where devices are described as including or comprising specific components, and methods are described as comprising or including specific steps, it is contemplated that devices of the present invention also consist essentially of, or consist of, the recited components, and methods of the present invention also consist essentially of, or consist of, the recited steps. Accordingly, throughout the present disclosure any described device or process can consist essentially of, or consist of, the recited components or steps.

The present invention contemplates a semiconductor device (e.g., a ferroelectric memory, such as a shadow RAM), using a capacitor having a ferroelectric film as a dielectric, wherein fatigue problems of the ferroelectric film are avoided, so as to reduce shortening of the memory life due to fatigue, wherein the structure of the device is simplified, wherein power consumption is small, and wherein the operational speed of the device is relatively large. According to this aspect of the present invention, the semiconductor device includes first and second data lines, one of the data lines being electrically connected to a source or drain region of a selection transistor of a memory cell, the other of the source and drain regions being connected to the capacitor having the ferroelectric film. A sense amplifier of the semiconductor device is connected between the first and second data lines to amplify a voltage between these data lines, and a power supply circuit supplies first and second voltages to the amplifier; the first voltage has a larger amplitude than that of the second voltage. At the first voltage, polarization of the ferroelectric capacitor can occur, such that the memory cell can operate in the nonvolatile mode. At the second voltage, polarization reversal of the ferroelectric capacitor is minimized, the memory cell operating in the volatile mode, so as to reduce the problem of fatigue.

A plate electrode of the ferroelectric capacitor of the memory cell is common to plate electrodes of ferroelectric capacitors of other memory cells, and a constant (fixed) voltage is applied to this plate electrode. By fixing the voltage of the plate electrode to be constant, power consumption of the common plate electrode is reduced.

According to the present invention, the semiconductor memory has a mode switching circuit. This mode switching circuit changes the sensing amplifier power supply voltage such that the memory cell operates in either the volatile mode or the nonvolatile mode. The semiconductor memory according to the present invention also can include an initial voltage generator which can output a plurality of different voltages (e.g., a capacitor plate voltage, volatile and nonvolatile write levels, volatile and nonvolatile read precharge levels, word line high level, etc.), and not merely just an external power supply potential.

The present invention also contemplates a method of operating a semiconductor device (e.g., a semiconductor memory, such as a shadow RAM) that includes a memory cell having a selection transistor and a capacitor using a ferroelectric film, two data lines, one of the data lines being electrically connected to the source or drain of the selection transistor (the other of the source or drain being electrically connected to a storage electrode of the capacitor), and a sense amplifier that is electrically connected between the two data lines for amplifying a voltage therebetween, wherein a constant (fixed) voltage is applied to a plate electrode of the capacitor (the other electrode of the capacitor, other than the storage electrode), and different voltages are applied to the sense amplifier depending on whether the device is to operate in the volatile mode or nonvolatile mode, the voltage applied during operation in the nonvolatile mode being larger in absolute value than that applied during operation in the volatile mode. The voltage applied during operation in the nonvolatile mode is large enough to cause polarization reversal of the ferroelectric film of the capacitor, while the voltage applied in the volatile mode is not sufficient to cause such polarization reversal. In the method of the present invention, just prior to the time external power is removed, information at that time held in the volatile mode can be stored in the nonvolatile mode; when power is restored, information stored in the nonvolatile mode can be recalled to the volatile mode. During power operation, the memory device can be operated in the volatile mode (e.g., like a DRAM).

Embodiment 1

The present invention will be described below referring to drawings showing embodiment 1.

FIGS. 1($a$) and 1($b$) show the operation of the ferroelectric shadow RAM of embodiment 1. FIG. 1($a$) shows a memory cell of the shadow RAM. The shadow RAM is constituted by arranging a plurality of such memory cells in an array. One electrode PL1 of ferroelectric capacitor C1 is connected in common with other memory cells. The other electrode SN1 of C1 is connected to data line DL1 through MOS transistor MN1. The gate electrode of MN1 is connected to a word line WL1. The ferroelectric film of the ferroelectric capacitor, for example, is made of PZT or $SrBi_2Ta_2O_9$. The former has an advantage that the remanent polarization value is large though the fatigue is strong, and the latter has an advantage that the fatigue is weak though the remanent polarization value is small. Moreover, the electrode is made of Pt or ruthenium oxide. Though the latter has the advantage that the fatigue is small, the material used for the ferroelectric capacitor is not restricted to them.

FIG. 1($b$) shows a hysteresis loop representing the operation of the ferroelectric capacitor. The graph shows the electric charge Q as the ordinate, obtained by multiplying the polarization of the ferroelectric capacitor by the capacitor area. Letting the potential of SN1 be V(SN1) and that of PL1 be V(PL1), the voltage V(SN1)−V(PL1) to be applied to the ferroelectric capacitor is shown as the abscissa. In the case of this shadow RAM, PL1 is connected in common with other memory cells and its potential is always kept at Vpl in volatile and nonvolatile modes. In this case, there is a relation: Vlf (second potential)<Vld (fourth potential)<Vpl (first potential)<Vhd (fifth potential)<Vhf (third potential).

In this embodiment, the data line DL1 is operated with a large amplitude in the nonvolatile mode at a low level Vlf or a high level Vhf. The state on the hysteresis loop shifts along the outside loop passing F1 and F0. Therefore, in this mode, nonvolatile information is stored by increasing remanent polarization. In the volatile mode, the data line DL1 is operated with a small amplitude at a low level Vld or a high level Vhd. The state on the hysteresis loop changes along the inside loop passing D1 and D0. In this mode, though storing is performed by using electric charge which is volatile information, the fatigue of the ferroelectric capacitor decreases because the polarization reversal for reversing stored data is small.

When this shadow RAM is used, it is normally operated in the volatile mode to reduce the fatigue of the ferroelectric capacitor and it is operated in the nonvolatile mode when turning on/off the power supply. In this case, the potential of the plate PL1 is kept constant at Vpl in the volatile and nonvolatile modes and these modes are changed in accordance with the magnitude of the amplitude of the data line. Therefore, this shadow RAM has advantages that conversion from nonvolatile information to volatile information (recall operation) and conversion from volatile information to nonvolatile information (store operation) are greatly simplified and the power consumption is decreased by a value corresponding to the fact that the plate electrode of the capacitor is not driven. Moreover, even when a capacitor using a ferroelectric film made of PZT and an electrode made of Pt is used, it is possible to make the most use of the advantage that the capacitor has a large remanent polarization because the fatigue can be reduced.

Figure 2:
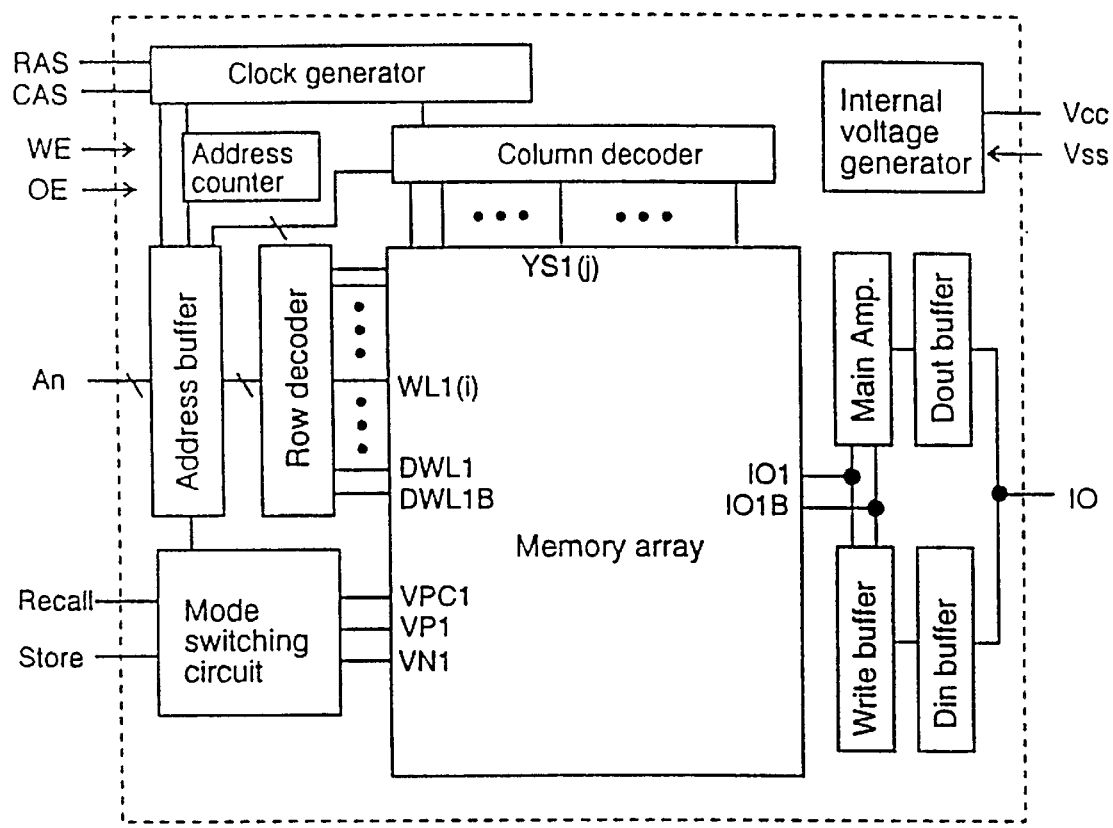
FIG. 2 is a block diagram of a ferroelectric shadow RAM.

FIG. 2 is a block diagram of a ferroelectric shadow RAM of the present invention. In FIG. 2, the memory array is a memory cell array including a memory cell, a word line, a data line, a sense amplifier, a precharging circuit, and a Y-gate circuit. An address signal output from the address buffer is input to a row decoder and a column decoder respectively. In accordance with the address signal, a predetermined word line is selected by the row decoder and a predetermined Y-switch circuit is selected by the column decoder. The output timing of the address signal is controlled by a signal output from the clock generation circuit.

A memory of the present invention is a shadow RAM having a volatile mode and a nonvolatile mode which are normal memory operations. The nonvolatile mode is used for the recall operation for converting nonvolatile data to volatile data and for the store operation for converting volatile data to nonvolatile data. To perform the recall and store operations, a recall instruction and a store instruction are issued from outside the chip by using external input pins Recall and Store as shown in FIG. 2. Recall and Store signals can also be generated by a combination of RAS, CAS, and address An. In this case, there is an advantage that the number of pins can be decreased. Moreover, it is also possible to automatically generate a Store signal when the external power-supply potential monitored in the chip starts lowering, and automatically generate a Recall signal when the power supply starts up. In this case, it is unnecessary for the user of this memory to issue the above instructions.

When these instructions are received, the recall operation and the store operation of all the bits are executed in the chip by using an internal address counter and mode change circuit. During this period, however, memory access from outside the chip is inhibited.

Array Circuit Structure

Figure 3:
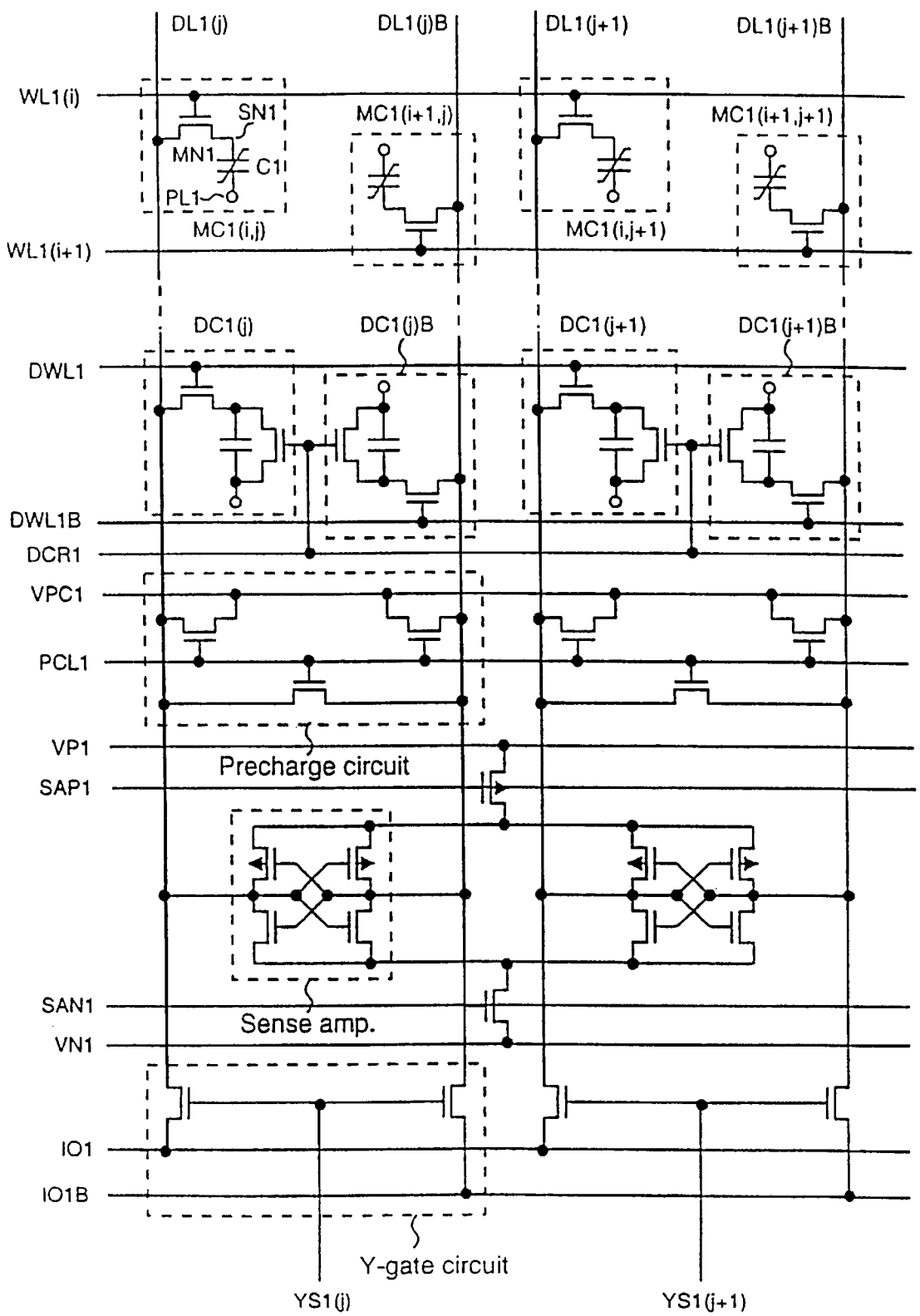
FIG. 3 is an illustration showing the structure of a memory array.

FIG. 3 is an illustration showing the array structure of the ferroelectric memory of FIG. 2. A memory cell comprises one ferroelectric capacitor C1 and one MOS transistor MN1. The plate PL1 of the ferroelectric capacitors of all the cells are connected in common and the potential is always kept at Vpl. The storage node SN1 of a memory cell MC(i,j) is connected to data line DL1(j) through MN1 and the gate electrode of MN1 is connected to a word line WL1(i). A memory array is constituted by arranging a plurality of such memory cells like a lattice. Dummy cells DC1(j) and DC1(j)B, a precharging circuit, and a sense amplifier are connected to a pair of data lines DL1(j) and DL1(j)B and, moreover, connected to a pair of I/O lines I01 and I00B through a Y-gate circuit.

Figure 4:
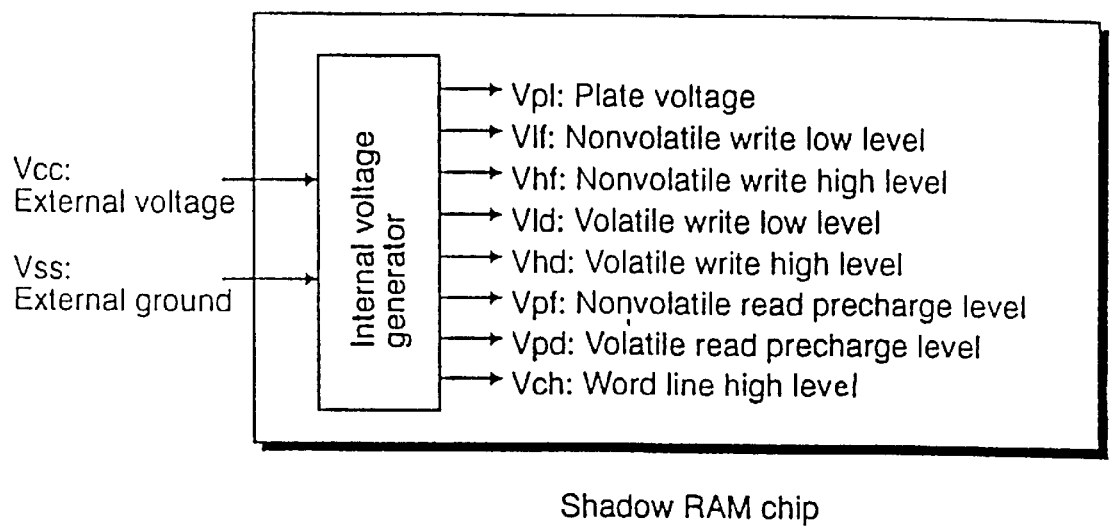
FIG. 4 is an illustration showing an internal power supply.

FIG. 4 shows a block diagram of an internal power generating circuit. In the case of the present invention, either the volatile mode or the nonvolatile mode is selected by varying the amplitude of a data line. Therefore, this circuit generates 8 levels of voltages by receiving external power-supply voltage Vcc and external ground voltage Vss. The plate voltage is Vpl, the nonvolatile-write low-level voltage is Vlf, the high-level voltage is Vhf, the volatile-write low-level voltage is Vld, the high level voltage is Vhd, the nonvolatile-read data-line precharging voltage is Vpf (sixth potential) and the volatile-read data-line precharging voltage is Vpd (seventh potential). Vch is the high-level voltage of a word line. These voltages have the relation: Vlf<Vld<Vhd<Vhf<Vch. In this case, by setting Vpl to a value close to (Vhf+Vlf)/2, the absolute value of the voltage to be applied to the ferroelectric capacitor at the time of nonvolatile write is minimized and this is effective to reduce the capacitor fatigue. Moreover, when setting Vpd to a value close to (Vhd+Vld)/2, it is unnecessary to use a dummy cell for volatile read, and, moreover, the signal voltage for "0" read is almost equal to that for "1" read. Therefore, this is effective to increase the read margin. Furthermore, Vpl and Vpd can be used in common, and in this case it is possible to decrease the number of power supply voltages. To raise the read voltage, it is effective to use Vpf together with Vlf or Vhf. In the following description of an example of operation, Vpd=Vpl and Vpf=Vlf.

Figure 5:
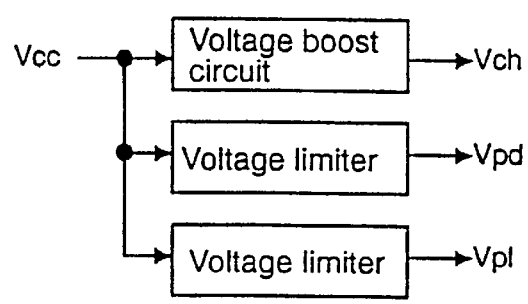
FIG. 5 is a second illustration showing an internal power supply.
Figure 6A:
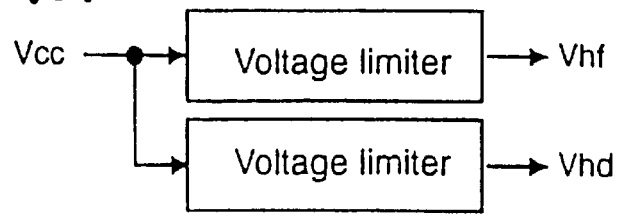
FIGS. 6(a) to 6(c) are third illustrations showing an internal power supply.
Figure 6B:
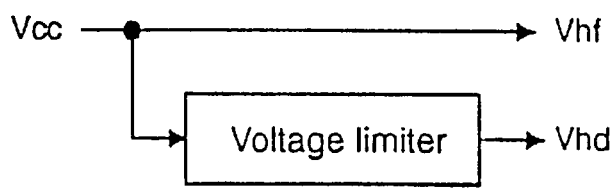
Figure 6C:
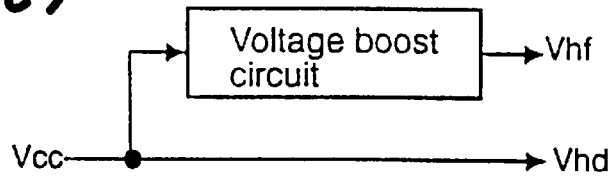
Figure 25:
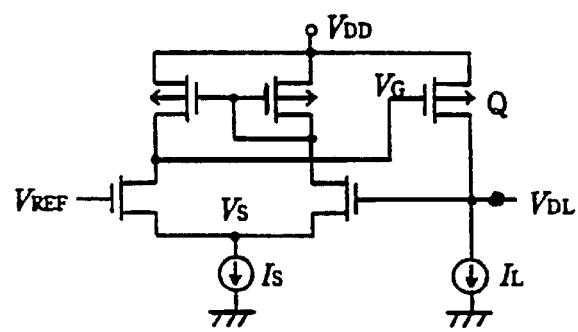
FIG. 25 shows a voltage limiter which can be used in the present invention.
Figure 26:
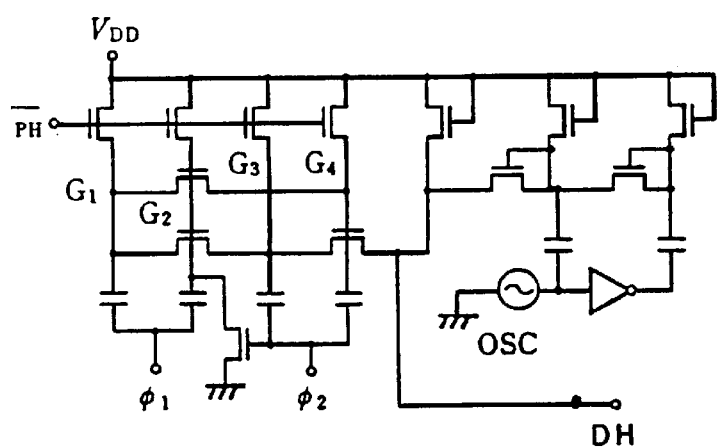
FIG. 26 is a boosted voltage generator which can be used in the present invention.

As shown in FIG. 5, Vch is generated by up-converting Vcc by an up-conversion circuit. Specific, illustrative voltage boost and voltage limiter circuits are respectively shown in FIGS. 26 and 25. In FIG. 26, $V_{DD}$ is the external power supply, and DH is the output. In FIG. 25, $V_{DL}$ is the output. Vpd and Vpl are generated by down-converting them by a down-conversion circuit. To generate Vhf and Vhd, there are three methods shown in FIGS. 6(a) to 6(c). The method of FIG. 6(a) generates Vhf and Vhd by down-converting Vcc. When Vcc is higher than the withstand voltages of the memory cell and the peripheral circuit, this method is effective. In the case of the method of FIG. 6(b), Vhf is equal to Vcc and Vhd is generated by down-converting it. Because Vhf is applied to the memory cell only for a short time when operation is performed in the nonvolatile mode, the reliability may be allowed even if Vcc is directly applied as Vhf. In this case, one down-conversion circuit is unnecessary, and, therefore, there is an advantage that the chip area and the power consumption can be decreased. In the case of the method of FIG. 6(c), Vhf is generated by up-converting and Vhd is equal to Vcc. When up-converted Vhf is lower than the withstand voltage of the transistor, it is possible to use this method and there is an advantage that the intensity of the signal in the nonvolatile mode can be increased.

Figure 7A:
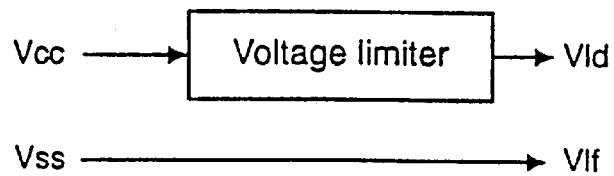
FIGS. 7(a) and 7(b) are fourth illustrations showing an internal power supply.
Figure 7B:
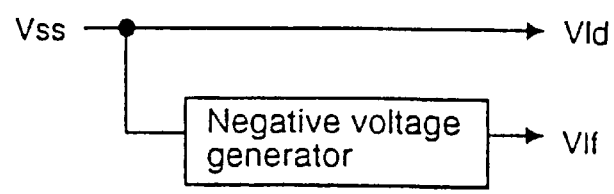
Figure 24:
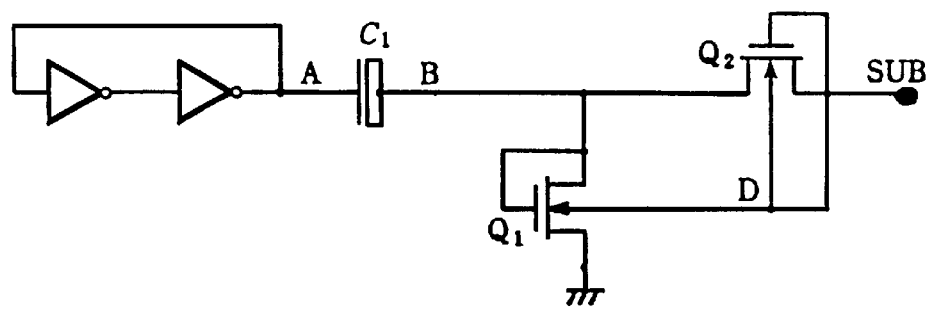
FIG. 24 shows an illustrative negative voltage generator which can be used in the present invention.

To generate Vld and Vlf, there can be used two methods as shown in FIGS. 7(a) and 7(b). In FIG. 7(a), Vld is generated by down-converting Vcc and Vlf is equalized with Vss. In this case, because only a down-conversion circuit is necessary, this method is normally effective. In FIG. 7(b), Vld is equalized with Vss and Vlf is generated by a negative voltage generating circuit. A specific, illustrative negative voltage generating circuit is shown in FIG. 24, with the output of the circuit being shown at SUB. In this case, not only a negative voltage generating circuit is necessary but also it is necessary to set the substrate voltage Vbb to a value lower than Vlf. However, there is an advantage that the intensity of the signal in the nonvolatile mode can be increased.

To use Vpf in common with Vhf, it is necessary to equalize Vpf to Vcc or generate Vpf by up-converting Vcc. To use Vpf in common with Vlf, it is necessary to equalize Vpf to Vss or generate Vpf by a negative voltage generating circuit. When Vpf is generated by up-converting Vcc or by the negative voltage generating circuit, there is an advantage that the intensity of the signal in the nonvolatile mode can be increased. When using Vpf in common with Vss or Vcc, there is an advantage that the number of down-conversion circuits can be decreased.

Mode Change Circuit

Figure 8:
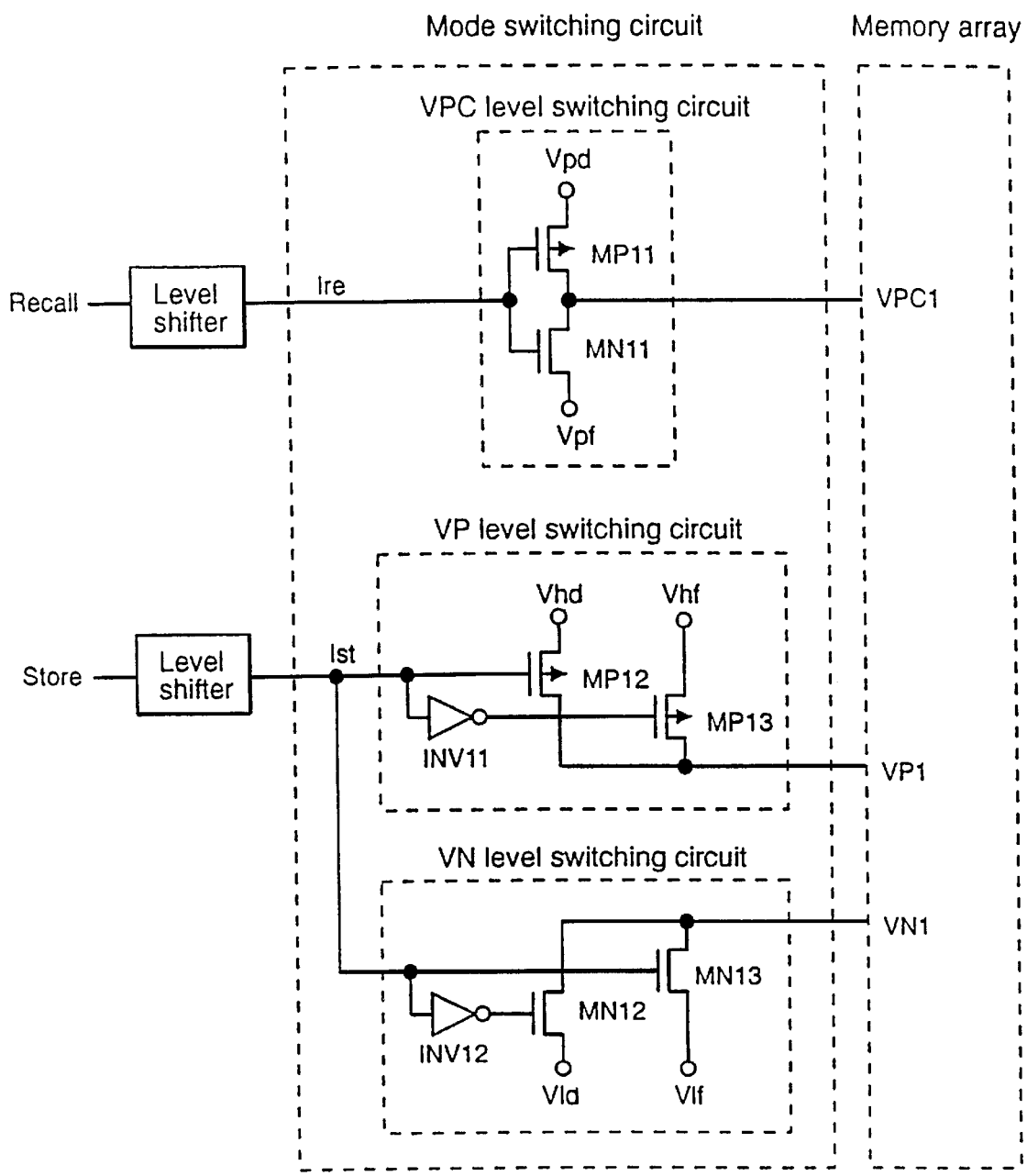
FIG. 8 is an illustration showing a mode change circuit.
Figure 9A:
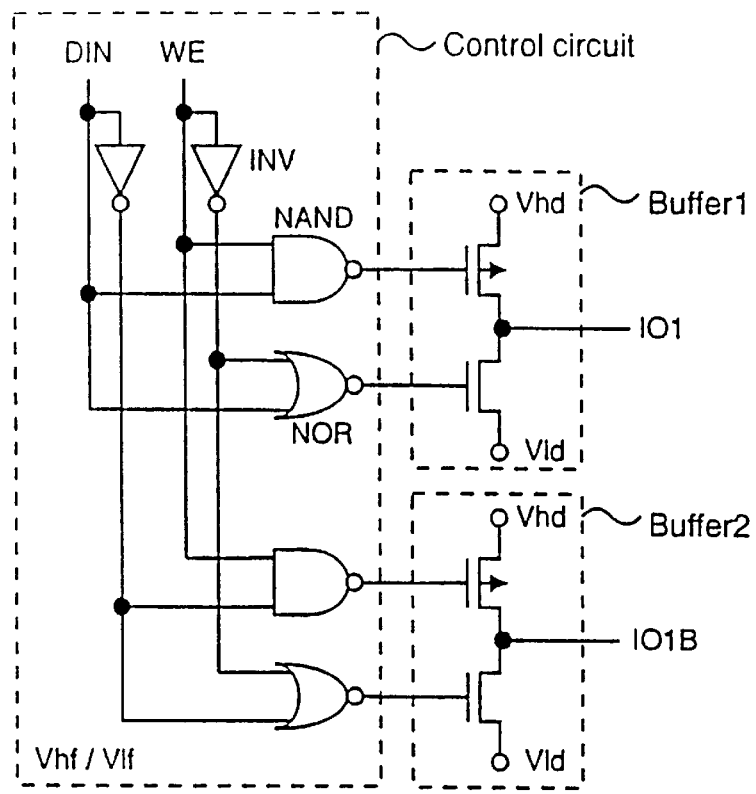
FIG. 9(a) is a circuit diagram of a write buffer, and FIGS. 9(b)–9(d) respectively show examples of NAND, NOR and INV circuits of this write buffer.
Figure 9B:
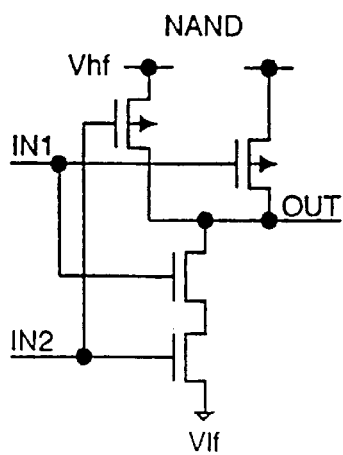
Figure 9C:
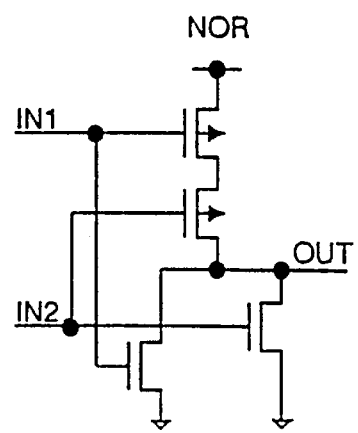
Figure 9D:
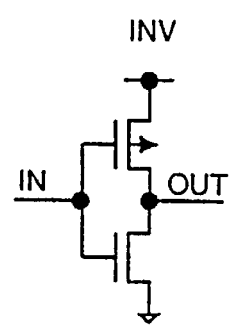

FIG. 8 illustrates the mode change circuit of FIG. 2, which includes a VP level change circuit, a VN level change circuit, and a VPC level change circuit. This circuit receives Recall and Store signals from outside the chip to change the levels of VP1, VN1, and VPC1. Because Recall and Store signals are of high level Vcc and low level Vss, they are converted to signals Ire and Ist of high level Vhf and low level Vlf by a level change circuit, and input to the mode change circuit. Moreover, the power supply voltage on the high level side of inverter circuits INV11 and INV12 in the mode change circuit is Vhf and the power supply voltage on the low level side of them is Vlf. This is because, when a Vcc/Vss level signal is input to MP12, MP13, MN12, and MN13, it is impossible to completely turn them off.

The VP level change circuit comprises a p-channel transistor MP12 whose one end is connected to the power supply voltage Vhd and whose other end is connected to the common source level supply line VP1, and a p-channel transistor MP13 whose one end is connected to the power supply voltage Vhf and whose other end is connected to VP1. A signal Ist generated by level-converting the signal Store and its inverted signal are supplied to the gates of MP12 and MP13 respectively. When Store is at low-level, MP12 is turned on and the level of VP1 is set to Vhd. When Store is at high-level, however, MP13 is turned on and the level of VP1 is set to Vhf.

The VN level change circuit of FIG. 8 comprises an n-channel transistor MN12 whose one end is connected to the power supply voltage Vld and whose other end is connected to the common source level supply line VN1, and an n-channel transistor MN13 whose one end is connected to the power supply voltage Vlf and whose other end is connected to VN1. Ist and its inverted signal are supplied to the gates of MN12 and MN13, respectively. When Store is at low-level, MN12 is turned on and the level of VN1 is set to Vld. When Store is at high-level, however, MN13 is turned on and the level of VN1 is set to Vlf.

The VPC level change circuit comprises a p-channel transistor MP11 and an n-channel transistor MN11. Signal Ire generated by level-converting the Recall signal is supplied to the gates of MP11 and MN11, respectively. When Recall is at low-level, MP11 is turned on and the level of VPC1 is set to Vpd. When Recall is high-level, however, MN11 is turned on and the level of VPC1 is set to Vpf.

In this embodiment, sense amplifier driving MOSs are dispersedly arranged in the array and common source level supply lines VN1 and VP1 are separated from control lines SAN1 and SAP1 as shown by the memory array structure of FIG. 3. Therefore, it is only necessary for the mode change circuit to change the DC levels of VN1 and VP1. However, it is also possible to arrange common source lines by arranging sense amplifier driving MOSs in one block. In this case, the power supply voltages of the driving MOSs are changed.

FIGS. 9(a)–9(d) show a circuit diagram of a write buffer. This circuit comprises a control section, a buffer1, and a buffer2, and the control section includes a NAND circuit and a NOR circuit. The power supply voltages of the NAND circuit and the NOR circuit are Vhf and Vlf. However, the power supply voltages of the buffers are Vhd and Vld, and data is written in the I/O lines with small amplitudes. When data is written, WE is set to Vhf to actuate the buffers 1 and 2 and the data of DIN is output to the I/O line pair. When data is not written, WE is set to Vlf and the buffers 1 and 2 are kept in high-impedance states. In the case of a shadow RAM of the present invention, the outputs of the buffers can be always of small amplitude because the write of the information from outside the chip is necessarily volatile write.

Recall operation of Embodiment 1

Figure 10:
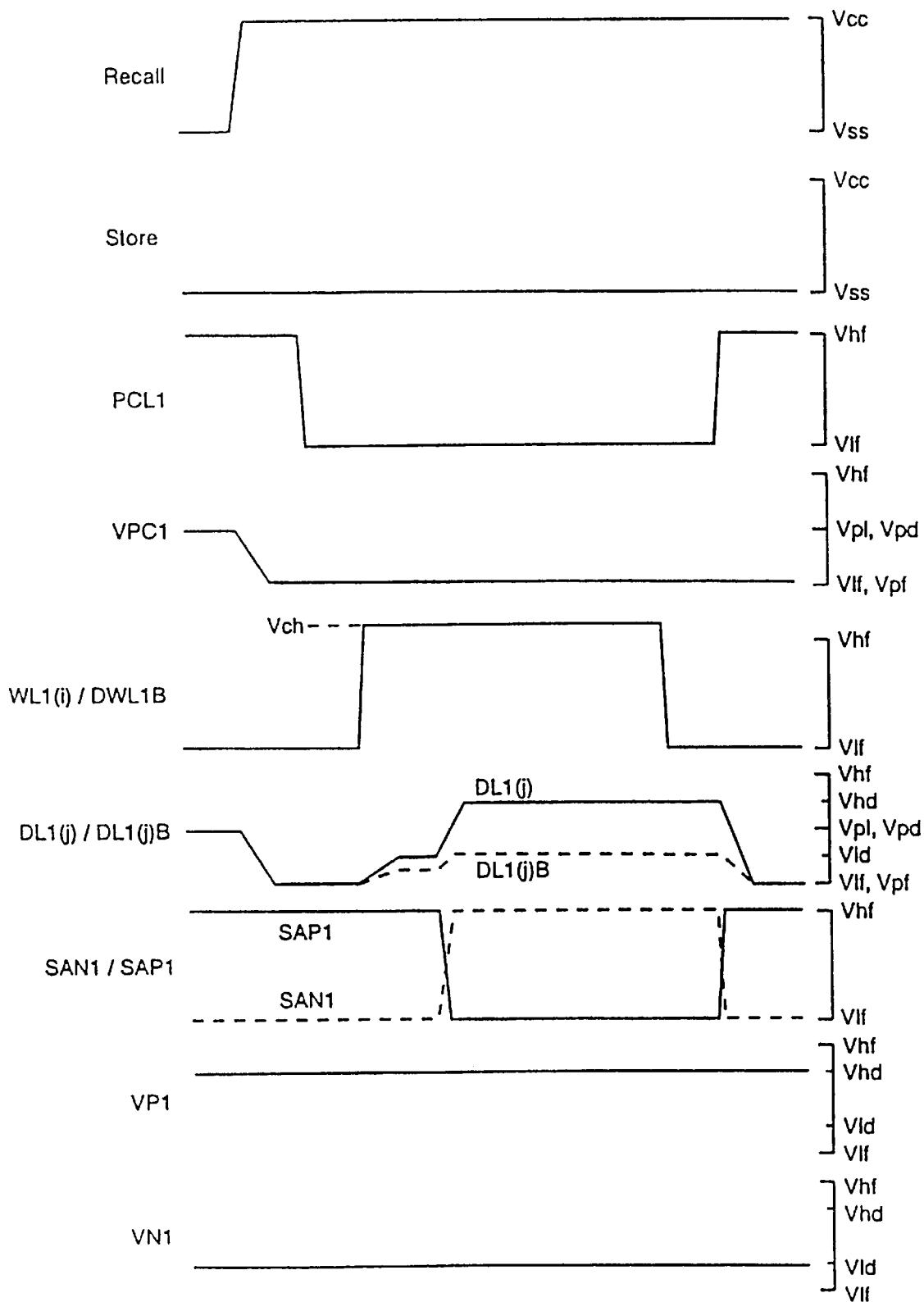
FIG. 10 is a timing chart of the recall operation of embodiment 1.

FIG. 10 shows a timing chart of the recall operation in the nonvolatile mode. The memory stores only nonvolatile information while the power supply is off. To start using this memory, the power supply is turned on and, thereafter, nonvolatile information (orientation of polarization) is read out of all memory cells and then written again as volatile information (polarity of electric charge). By performing the above operation, the volatile information in the memory cells becomes the same as the nonvolatile information when use of this memory was ended last time.

Immediately after the power supply is turned off, the ferroelectric capacitor is in the state of F0 or F1 of FIG. 1. This is because SN1 and PL1 are both at Vss while the power supply is turned off, and SN1 is also raised up to Vpl due to the coupling of the ferroelectric capacitor when the power supply is turned on to raise the potential of PL1 up to Vpl while WL1 is kept down to Vlf.

When the Recall signal becomes high-level, the precharging level is set to Vpf by the VPC level change circuit, all the data lines for performing the recall operation are precharged to the level Vpf equal to VPC1 while PCL1 is Vhf. Moreover, in this period, the reset signal DCR1 of a dummy cell is also at Vhf and the potential of the storage node of the dummy cell is Vpl. In the above state, PCL1 is lowered to Vlf to make the data lines floating, and thereafter, the word line WL1(j) and the dummy word line DL1(j)B are raised up to Vch.

For the memory cells MC(i,j) and MC(i,j+1), a voltage at which V(SN1)–V(PL1) is negative is applied to their ferroelectric capacitors. Therefore, when the initial state is F0, no polarization reversal occurs. However, when the initial state is F1, polarization reversal occurs. The amount of electric charge flowing toward the data lines DL1(j) and DL1(j+1) varies depending on the presence or absence of the polarization reversal. Since the amount of electric charge is divided in accordance with the capacitance of the ferroelectric capacitor and the parasitic capacitance of the data line, the voltage generated in the data line is determined. Therefore, the potential of the data line depends on whether the polarization is reversed or not. When the initial state of the ferroelectric capacitor is F0 of FIG. 1(b), V0 is generated in the data line. When the initial state of the capacitor is F1, V1 is generated in the data line. In this case, the directions of remanent polarization are once aligned and nonvolatile information is destroyed.

In dummy cells DC(j)B and DC(j+1)B, the electric charge flows out of the normal capacitor reset to Vpl toward the data lines DL1(j)B and DL1(j+1)B. The normal dielectric capacitor is so designed that the voltage Vref generated in the data line in this case is between V0 and V1. Therefore, a potential difference in the direction corresponding to "0" or "1" of nonvolatile data is generated in the data line pair. In this case, the dummy cell can also output the above intermediate potential by changing the area of the ferroelectric capacitor. In this case, there is an advantage that the design is simplified because the dummy cell can be simultaneously fabricated at the time when the memory cells are fabricated and the characteristics of the dummy cell are similar to those of the memory cells. Moreover, there is a method of generating an intermediate potential by short-circuiting a cell in which polarization reversal occurs and a cell in which no polarization reversal occurs, as disclosed in Japanese Patent Laid-Open No. 110893/1990. In this case, it is possible to easily improve the accuracy of the intermediate potential.

Though a method of storing one-bit information in one memory cell has been described above, there is also a method of storing one bit in two memory cells. In this case, unlike FIG. 3, a cell MC1(i,j)B paired with MC1(i,j) is connected to the intersection between WL1(i) and DL1(j)B to write polarizations in different direction from each other. In this case, by reading the information above, the potentials of the data lines DL1(j)B and DL1(j+1)B are set to V0 or V1. In this case, though there is a disadvantage that the area of the cells for storing one bit increases, there is an advantage that the read signal can be increased in amplitude.

Whether the method of using dummy cells or the method of using two memory cells is used, a potential difference in the direction corresponding to stored information is generated in a pair of data lines. The potential difference is amplified by a sense amplifier. SAN1 is driven from Vlf to Vhf and SAP1 is driven from Vhf to Vlf. Out of the pair of data lines, a data line of high potential is amplified up to potential Vhd equal to VP1 and a data line with low potential is amplified up to potential Vld equal to VN1. Thereafter, a word line is set to Vlf. Thereby, electric charge corresponding to the polarization direction is accumulated in the ferroelectric capacitor. That is, nonvolatile information is converted to volatile information. In this case, the state of the ferroelectric capacitor shifts to the point denoted by D0 or D1 on the hysteresis loop of FIG. 1(b), the remanent polarization decreases and the nonvolatile information is destroyed.

Finally, SAN1 is driven from Vhf to Vlf and SAP1 is driven from Vlf to Vhf to turn off the sense amplifier, and thereafter, PCL1 is raised to Vhf, data lines are precharged to Vlf, and the recall operation of the next memory cell is started. Moreover, DCR1 is also raised to Vhf to reset the dummy cells. Because all the memory cells connected to one word line are simultaneously recalled, the above operation is performed for every word line to convert the nonvolatile information in all the memory cells to the volatile information. Memory access is inhibited during the recall operation. When the recall operation of all bits is completed, the Recall signal returns to the low level to terminate the nonvolatile operation mode, and, thus, normal memory access is enabled.

Figure 1B:
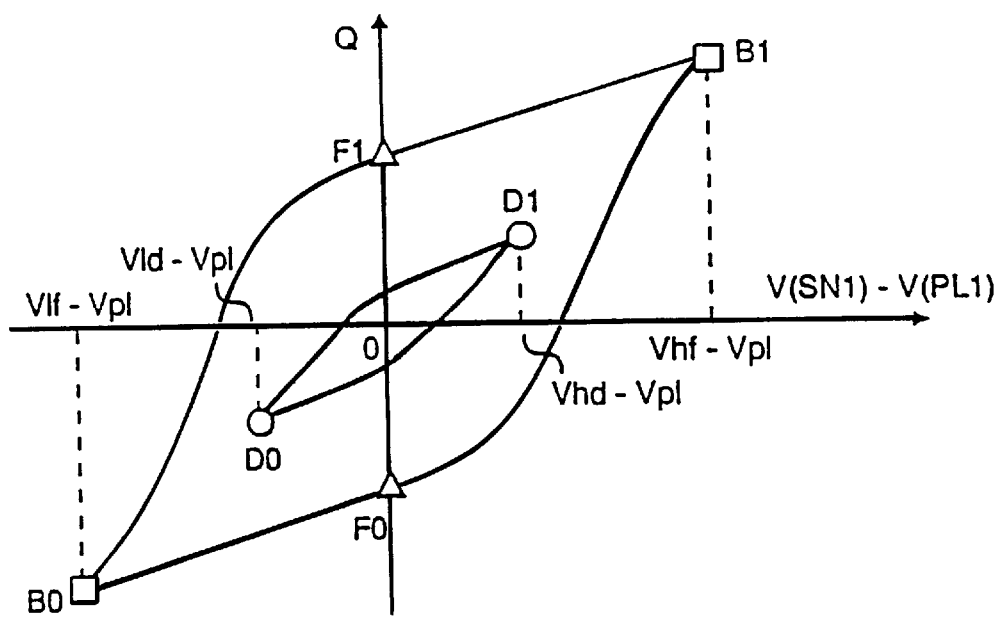
FIG. 1(b) shows a hysteresis loop representing the operation of a ferroelectric capacitor of this memory cell of the first embodiment.

In this embodiment, when recalling the ferroelectric capacitor in the state of F1 of FIG. 1(b), polarization reversal occurs during operation. However, the voltage for writing data by amplifying the signal by the sense amplifier is lower than that of conventional example 3, and the capacitor fatigue can be reduced. Moreover, the potential of the plate PL1 of the ferroelectric capacitor is always kept at Vpl during the recall operation, and hence a very simple recall operation is possible compared to conventional examples 1 and 2.

Volatile Read Operation of Embodiment 1

Figure 11:
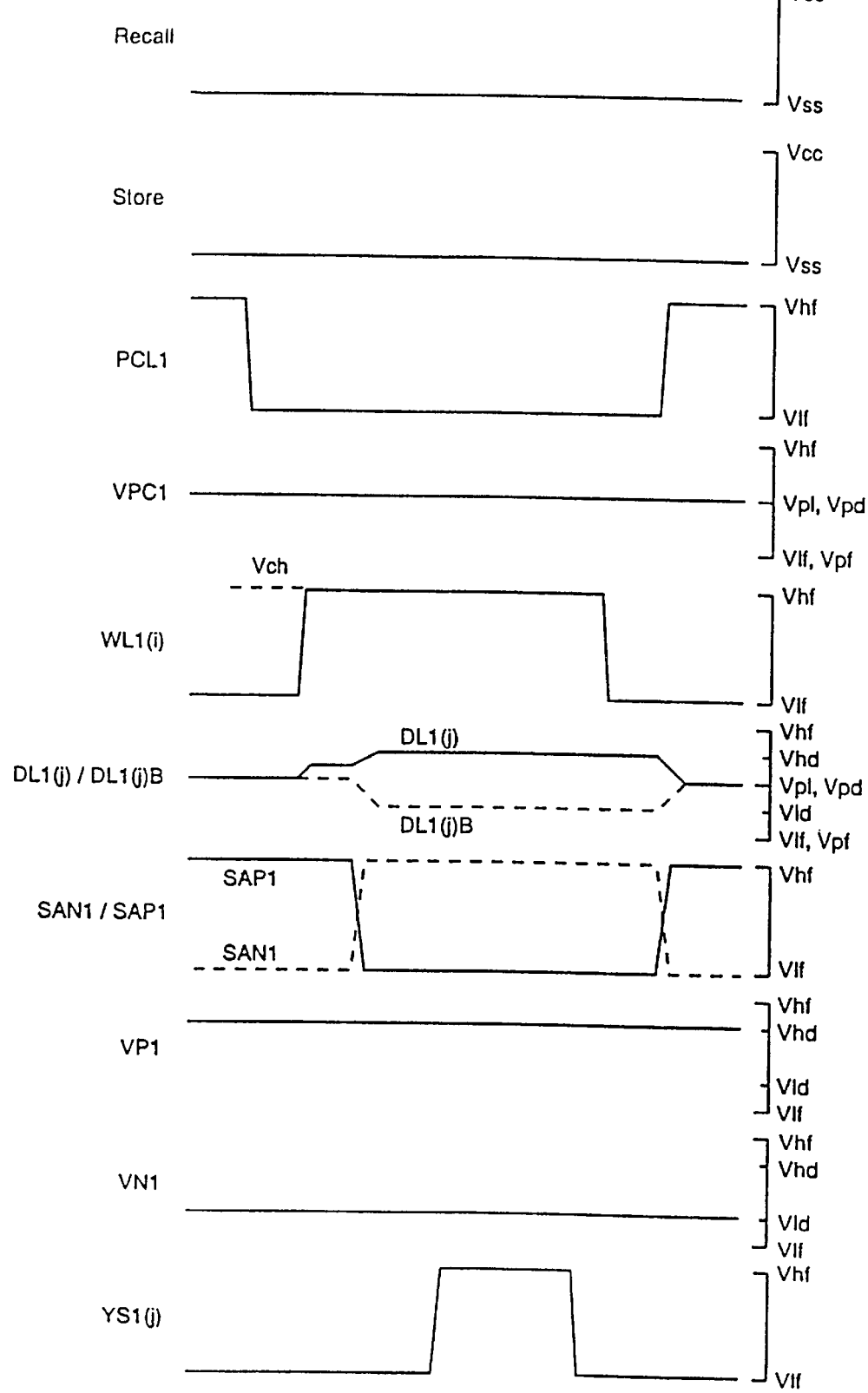
FIG. 11 is a timing chart of the volatile read operation of embodiment 1.

FIG. 11 shows a timing chart of a volatile information read operation. Normal data read at the time of memory access is performed in the volatile mode. While PCL1 is Vhf, every data line is precharged to level Vpd equal to VPC1. In this state, PCL1 is lowered to Vlf to make the data lines float, and, thereafter, selected word line WL1(i) is raised up to Vch. Because no dummy cell is used for volatile read, DCR1 and DWL1(i)B remain at Vlf.

In memory cells MC1(i,j) and MC1(i,j+1), electric charge flows from the ferroelectric capacitors toward the data lines DL1(j) and DL1(j+1). When volatile information is "0" at the beginning, that is, when the initial state of the ferroelectric capacitor is D0 in FIG. 1(b), a voltage VOd is generated in the data lines but this voltage is lower than Vpd. When volatile information is "1" at the beginning, that is, when the initial state of the ferroelectric capacitor is D1 in FIG. 1(b), a voltage Vld is generated in the data lines but this voltage is higher than Vpd.

However, the other data lines DL1(j)B and DL1(j+1)B of the data line pairs remain at Vpd. Therefore, a potential difference corresponding to "0" or "1" of volatile data is generated in the data line pair. This potential difference is amplified by the sense amplifier. SAN1 is driven from Vlf to Vhf and SAP1 is driven from Vhf to Vlf. A data line of high potential, out of the data line pair, is amplified up to the potential Vhd equal to VP1, and a data line of low potential is amplified up to the potential Vld equal to VN1. Thereafter, YS1(j) corresponding to the selected data line pair is raised up to Vhf to open a Y-gate circuit, read data and send them onto an I/O data line pair. Thereafter, word lines are lowered, and SAN1 is driven from Vhf to Vlf and SAP1 is driven from Vlf to Vhf to turn off the sense amplifier, and then, PCL1 is raised to Vhf to precharge the data lines to Vpd.

Therefore, the potential of the plate PL1 of the ferroelectric capacitor is kept at Vpl during volatile read operation. However, no polarization reversal of the ferroelectric capacitor, and no film fatigue, occurs.

Volatile Write Operation of Embodiment 1

FIG. 12 shows a timing chart of the volatile information write operation. Volatile read and rewrite are performed before write in a selected row, and new data is written only in selected cells. In the above read operation, data is amplified by a sense amplifier, and, thereafter, YS1(j) is raised up to Vhf to open a Y-gate circuit. Moreover, the write buffer is operated to write data in the memory cell MC(i,j). Thereafter, WL1(i) is lowered to Vlf, SAN1 is driven from Vhf to Vlf and SAP1 is driven from Vlf to Vhf to turn off the sense amplifier, and then, PCL1 is raised to Vhf to precharge data lines to Vpd to end the volatile write operation.

Therefore, even during the volatile write operation, the potential of the plate PL1 of the ferroelectric capacitor is kept at Vpl. At the time of volatile write of this embodiment, the polarity of the voltage applied to the ferroelectric capacitor is reversed to write data opposite to the original data.

Therefore, polarization reversal may occur. However, because the absolute value of the applied voltage is decreased compared to the nonvolatile write operation, in the volatile write operation of this embodiment, the polarization reversal value is small, and therefore, it is possible to further reduce film fatigue compared to the case of the volatile write operation of conventional example 3.

Refresh Operation of Embodiment 1

Because volatile information is stored in the form of electric charge accumulated in the ferroelectric capacitor, it is lost due to the pn-junction leak current and the sub-threshold current of the transistor with the passage of time. Therefore, a refresh operation is performed periodically in order to prevent information from being destroyed. This is an operation of the volatile read shown in FIG. 11 of all memory cells to return the state of the ferroelectric capacitor to the original state. However, it is unnecessary to operate the Y-gate circuit. Because the memory cells connected to one word line are simultaneously refreshed, all the word lines are selected in order. The maximum refresh time which is the maximum value of the periods required to refresh one word line must be a time in which a signal can be read at a high reliability even if the amount of accumulated electric charge is decreased due to the leak current and the amplitude of the read signal decreases.

Even during the refresh operation, the potential of the plate PL1 of the ferroelectric capacitor is kept at Vpl. Moreover, because the polarization of the ferroelectric capacitor is not reversed, no film fatigue occurs.

Store Operation of Embodiment 1

In the first embodiment, because nonvolatile information is destroyed when the volatile mode starts, it is necessary to convert volatile information to nonvolatile information before turning off the power supply (store operation). FIG. 13 shows a timing chart of the store operation. When the Store signal becomes high-level, the potentials of VN1 and VP1 are set to Vlf and Vhf respectively by the VP level change circuit and VN level change circuit of FIG. 8.

The same operation as volatile read is performed to amplify the signal voltage generated in a data line by a sense amplifier. SAN1 is driven from Vlf to Vhf and SAP1 is driven from Vhf to Vlf. One data line with high potential, out of a data line pair, is amplified up to potential Vhf equal to VP1, and the other data line with low potential is amplified up to the potential Vlf equal to VN1. Thereafter, a word line is set to Vlf. Volatile information is converted to nonvolatile information by the above operation. That is, when the volatile information is "0" at the beginning {D0 in FIG. 1(b)}, it is converted to "0" (B0) of nonvolatile information. When the volatile information is "1" (D1) , it is converted to "1" (B1) of nonvolatile information.

Finally, SAN1 is driven from Vhf to Vlf and SAP1 is driven from Vlf to Vhf to turn off a sense amplifier, and thereafter, PCL1 is raised to Vhf to precharge data lines to Vpd. Because the store operation of memory cells connected to one word line is simultaneously performed, this operation for all word lines is performed in order to convert the volatile information in all memory cells to nonvolatile information. When the store operation for all bits is ended, the Store signal is returned to the low level to end the nonvolatile operation mode and turn off the power supply. Though the states of B0 and B1 shift to F0 and F1 after turning off the power supply, nonvolatile information is stored.

During the above store operation, the potential of the plate PL1 of the ferroelectric capacitor is kept at Vpl. Moreover, no polarization reversal occurs. It is possible to perform this operation at a very high speed in a time almost equal to that of the refresh operation in the volatile mode, compared to the conventional example 1 and 2.

Embodiment 2

Figure 14A:
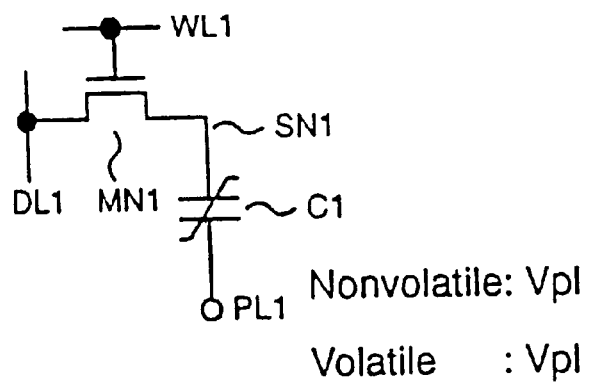
FIG. 14(a) shows a memory cell of a second embodiment of the present invention.

A second embodiment of the present invention will be described below. FIG. 14(a) shows a memory cell used in this embodiment. Similarly to the first embodiment, one electrode (plate electrode) PL1 of a ferroelectric capacitor of this embodiment is connected in common with other memory cells so that the potential of the electrode is kept at Vpl. The memory cell of the shadow RAM, the block diagram, the array structure, the functions of the internal power supply, the mode change circuit, and the write buffer of this embodiment can be the same as those of the first embodiment. However, the internal power-supply voltage levels of this embodiment are different from those of the first embodiment. It is assumed that the relation Vlf<Vld<Vhd<Vpl<Vhf<Vch or Vlf<Vpl<Vld<Vhd<Vhf<Vch holds in regard to the internal power supplies shown in FIG. 4. The case where Vlf<Vld<Vhd<Vpl<Vhf<Vch, Vpf=Vlf, and Vld<Vpd hold will be described below.

Figure 14B:
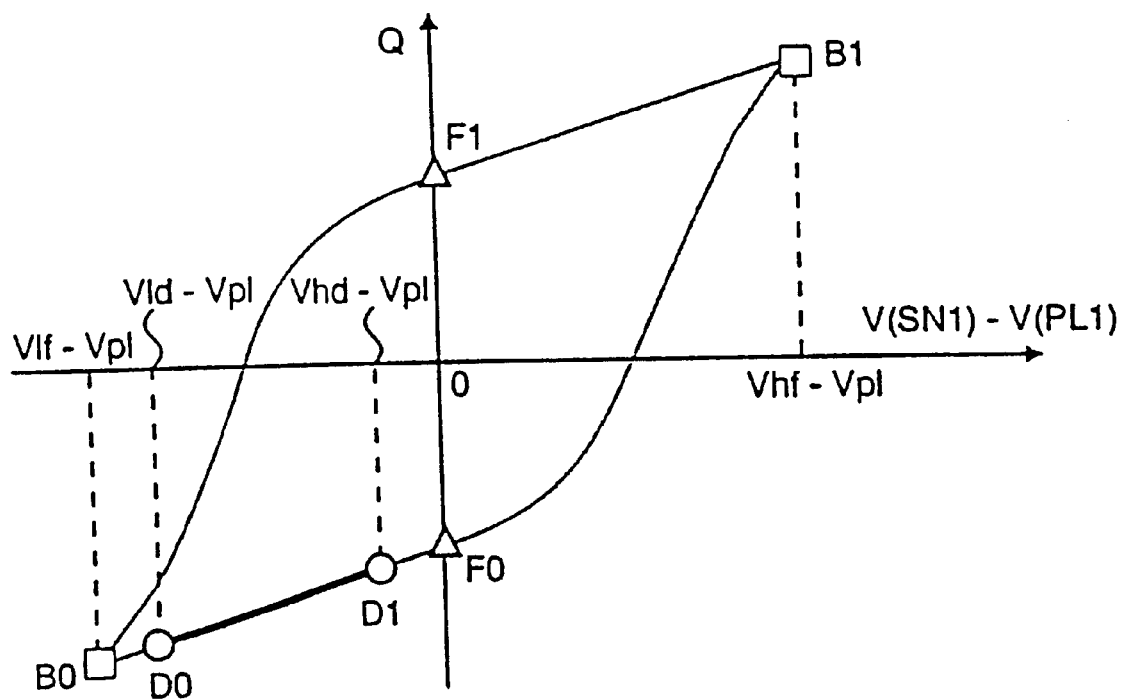
FIG. 14(b) shows a hysteresis loop representing the operation of a ferroelectric capacitor of this memory cell of the second embodiment.

FIG. 14(b) shows a hysteresis loop when the above relations hold. During the recall and store operations in the nonvolatile mode, the state of the ferroelectric capacitor changes along the hysteresis loop passing through F1 and F0 in FIG. 14(b). In the nonvolatile mode, the state changes between D1 and D0. Therefore, in the volatile mode, only a voltage of one polarity is applied to the ferroelectric capacitor, and no polarization reversal occurs. Therefore, there is an advantage that no fatigue occurs in the volatile mode.

Recall Operation of Embodiment 2

Figure 15:
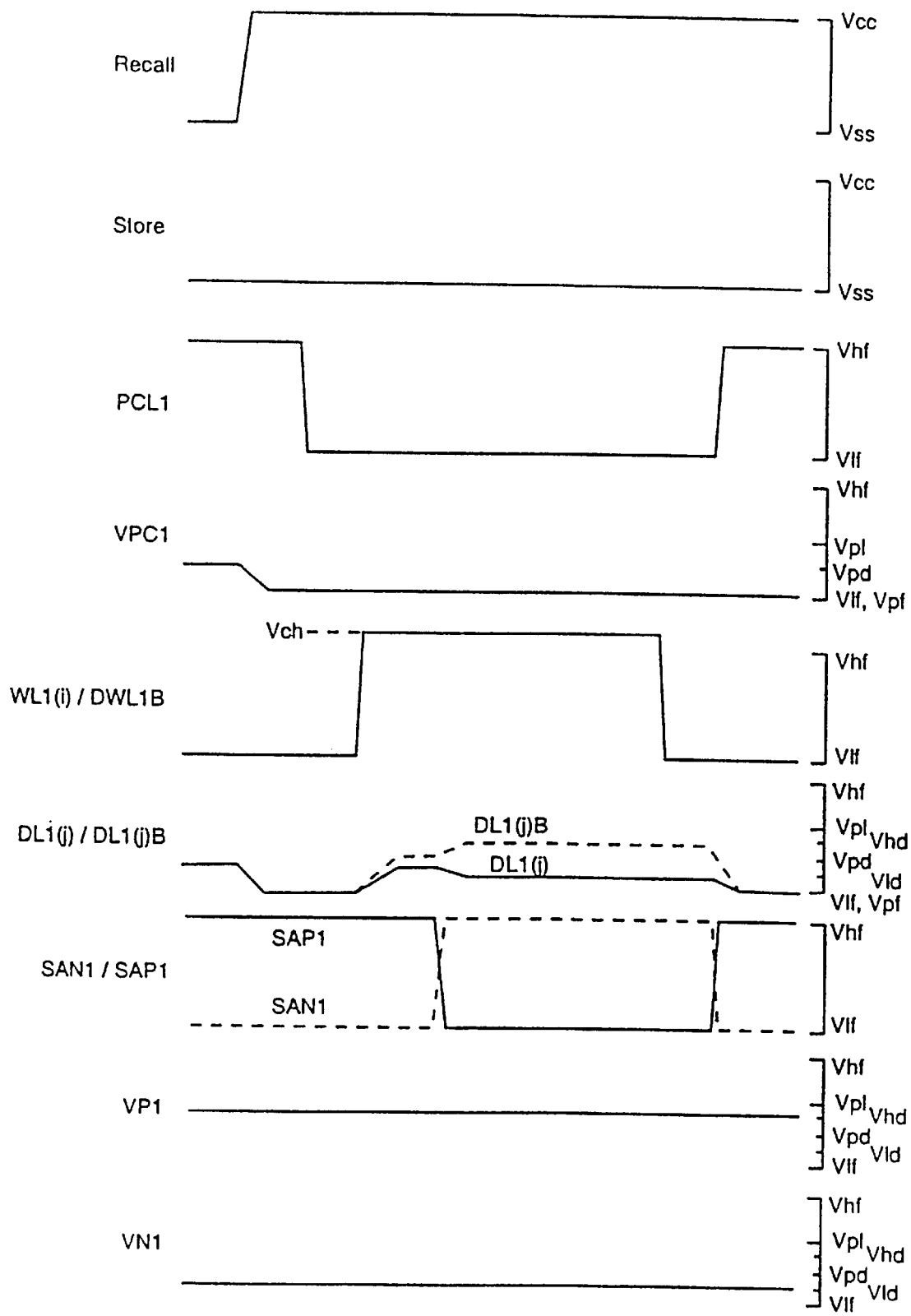
FIG. 15 is a timing chart of the recall operation of this second embodiment.

FIG. 15 shows a timing chart of a recall operation. The recall operation of this embodiment is controlled similarly to that of the first embodiment. However, this embodiment is different from the first embodiment in that, when a nonvolatile read signal is amplified by the sense amplifier, potentials Vld and Vhd of the data line pair are both lower than Vpl. Therefore, unlike the first embodiment, there is an advantage that no polarization reversal nor fatigue occurs when rewriting read data.

Volatile Read Operation of Embodiment 2

Figure 16:
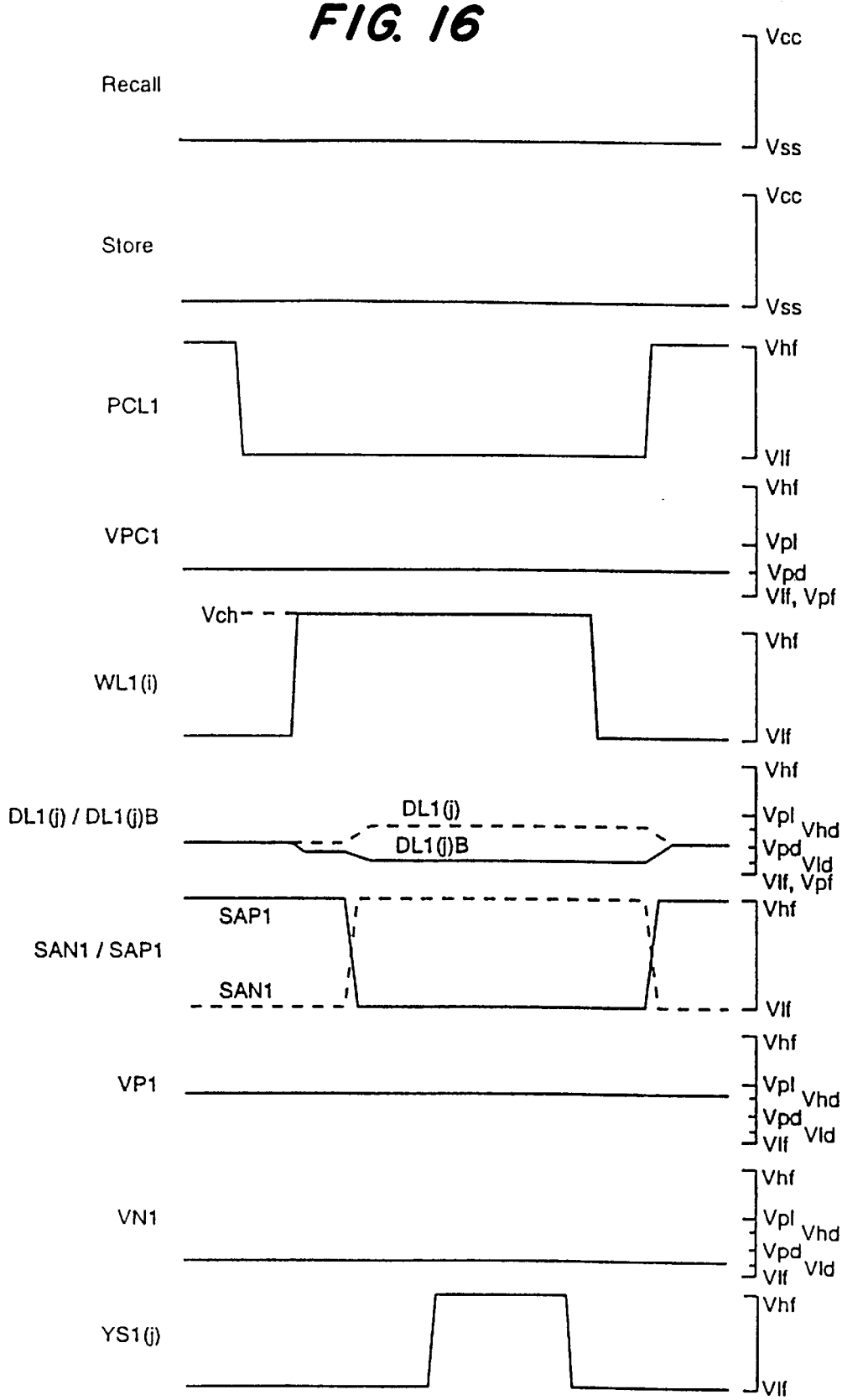
FIG. 16 is a timing chart of the volatile read operation of this second embodiment.
Figure 17:
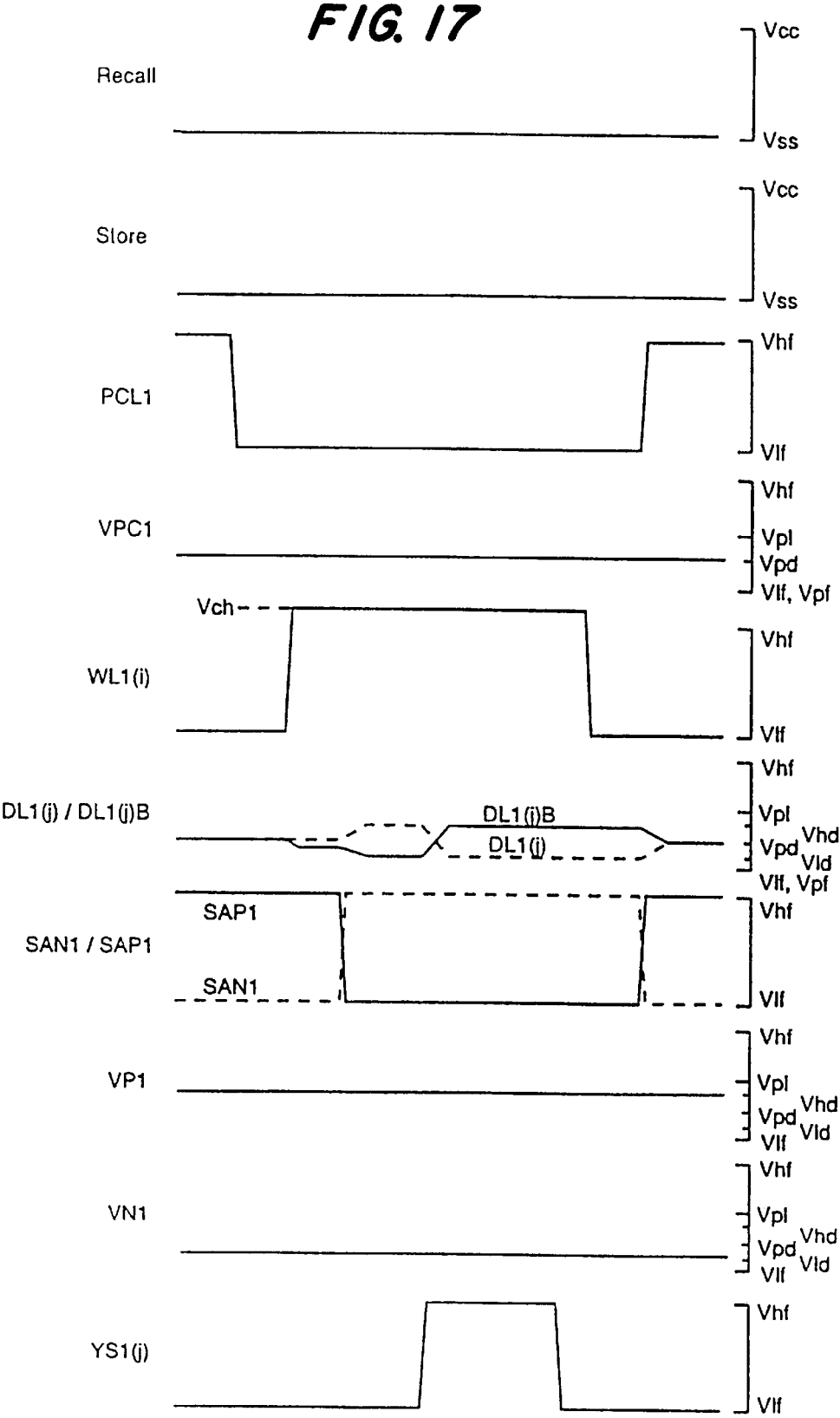
FIG. 17 is a timing chart of the volatile write operation of this second embodiment.

FIGS. 16 and 17 respectively show timing charts of read operation and write operation for volatile information. The volatile read operation, write operation, and refresh operation of this embodiment are controlled in the same way as that of the volatile read operation of embodiment 1. However, this embodiment is different from the first embodiment in that both potentials Vld and Vhd of the data line pair are lower than Vpl when amplifying a nonvolatile read signal by the sense amplifier and writing data from the IO line. Therefore, this embodiment, unlike the first embodiment, has an advantage that no film fatigue occurs because only a voltage of one polarity is applied to the ferroelectric capacitor at the time of volatile read and volatile write of data and thereby no polarization is reversed.

Store Operation of Embodiment 2

Figure 18:
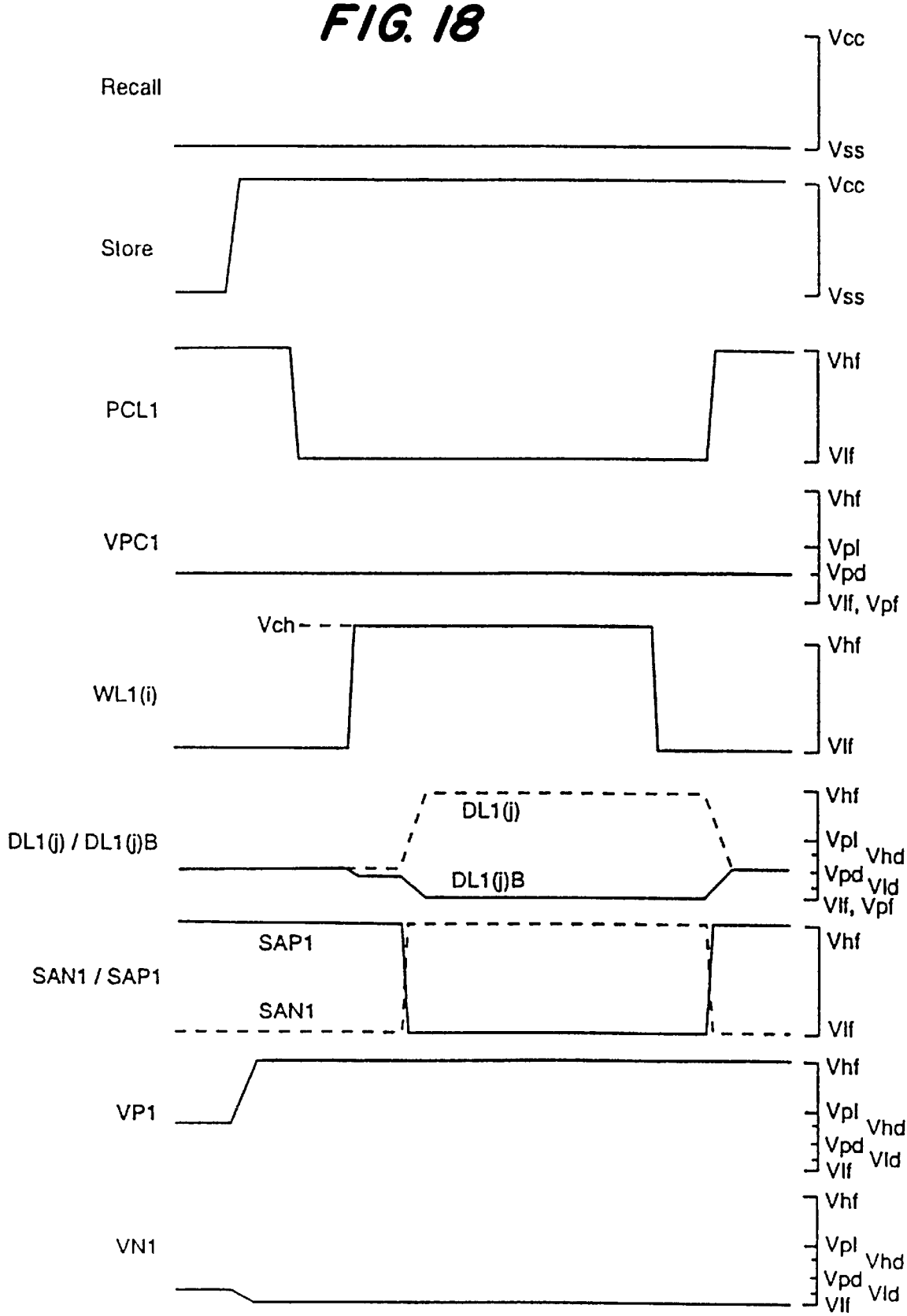
FIG. 18 is a timing chart of the store operation of this second embodiment.

FIG. 18 shows a timing chart of the store operation of this second embodiment. The store operation of this second embodiment is controlled in the same way as that of the store operation of the first embodiment is. However, this embodiment is different from the first embodiment in that when performing the store operation for the capacitor in the state D1 of FIG. 14(b), the state shifts to B1 and polarization reversal occurs in this embodiment, though no polarization reversal occurs during the store operation in the first embodiment.

Embodiment 3

Figure 19A:
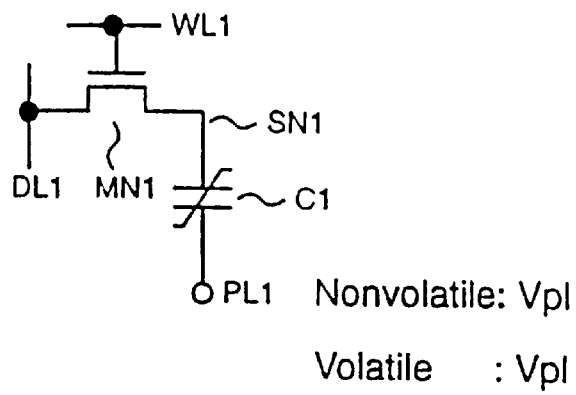
FIG. 19(a) shows a memory cell of a third embodiment of the present invention.

A third embodiment of the present invention will be described below. FIG. 19(a) shows a memory cell used in this embodiment. Similarly to embodiment 1, one electrode (plate electrode) PL1 of the ferroelectric capacitor of this embodiment is connected in common with other memory cells, and the potential of the electrode is kept at Vpl. The memory cells of the shadow RAM, the block diagram, the array structure, the functions of the internal power supply, the mode change circuit, and the write buffer of this embodiment can be the same as those of the first embodiment. However, this embodiment is different from the first embodiment in that the data line amplitude for volatile write is further limited. That is, the relations of the internal power-supply voltages are Vlf<Vpl-Vc<Vld<Vpl<Vhd<Vpl+Vc<Vhf<Vch and Vld<Vpd<Vhd. Vpf and Vpl are different from each other in voltage. In this case, Vc is the minimum voltage to be applied to both ends of the ferroelectric capacitor in order to reverse the polarization of the capacitor.

Figure 19B:
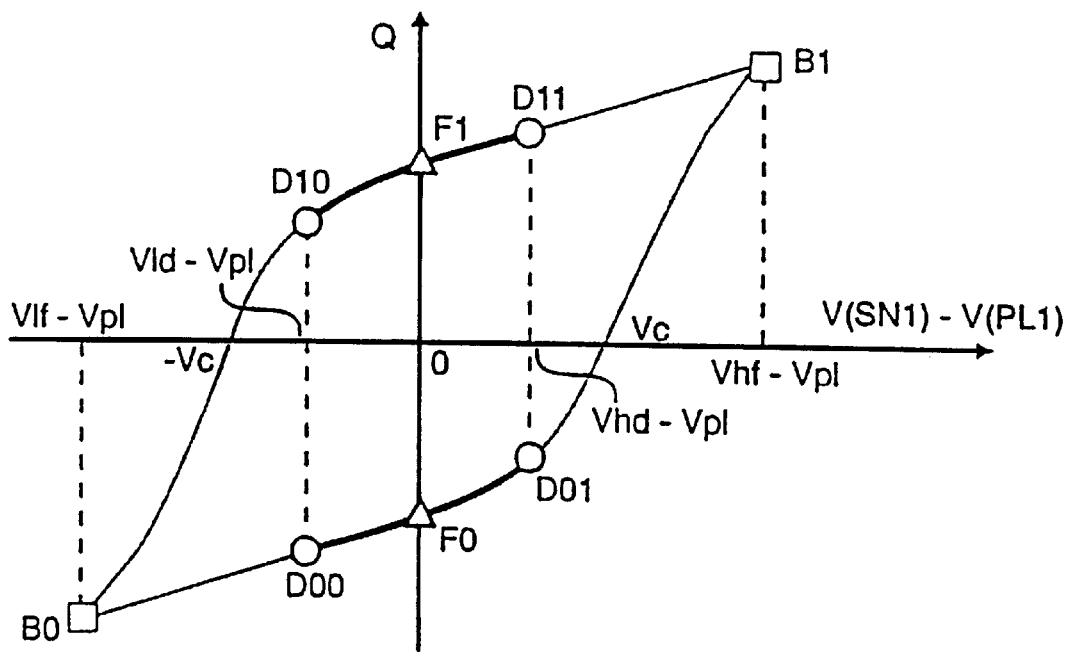
FIG. 19(b) shows a hysteresis loop representing the operation of a ferroelectric capacitor of this memory cell of the third embodiment.

FIG. 19(b) shows a hysteresis loop of the ferroelectric capacitor of this embodiment. When the potentials of both ends SN1 and PL1 of the ferroelectric capacitor are equal to each other, residual electric charge Q can take two states F1 and F0. The two states are determined by the orientation of the remanent polarization of the capacitor, and represent nonvolatile information which does not disappear even if the power supply is turned off. Therefore, it is possible to write binary nonvolatile information "0" or "1" corresponding to the state F0 or F1 of the ferroelectric capacitor.

In addition to the above, this embodiment further stores binary volatile information. By setting potential V(SN1) of SN1 to Vld or Vhd when the state is present at F0 on the hysteresis loop, it shifts to D00 or D01. When the state is present at D00, negative electric charge is accumulated in the capacitor. When the state is present at D01, positive electric charge is accumulated in the capacitor. Similarly, by setting V to Vld or Vhd when the state is present at F1 on the hysteresis loop, the state shifts to D10 or D11. When the state is present at D10, negative electric charge is accumulated in the ferroelectric capacitor. When the state is present at D11, positive electric charge is accumulated in the capacitor. Therefore, binary information can be stored in accordance with the positive or negative electric charge accumulated in the ferroelectric capacitor. Because the electric charge disappears upon turning off the power supply, the information is volatile information.

It is possible to store the above nonvolatile information and volatile information independently. When reading and writing volatile information, V(SN1) moves between Vld and Vhd. In this case, because the relations |Vld-Vpl|<Vc and |Vhd-Vpl|<Vc hold, a voltage high enough to reverse polarization is not applied to both ends of the capacitor and the orientation of remanent polarization is not influenced by the above operation. That is, when nonvolatile information is "0", the state shifts to D00 or D01 according to whether volatile information is "0" or "1". However, when resetting V(SN) to Vpl, the state returns to F0. Similarly, when nonvolatile information is "1", the state shifts to D10 or D11 according to whether volatile information is "0" or "1". However, when resetting V(SN) to Vpl, the state returns to F1. Therefore, both information can be stored because nonvolatile information is not destroyed due to read or write of volatile information.

Figure 20:
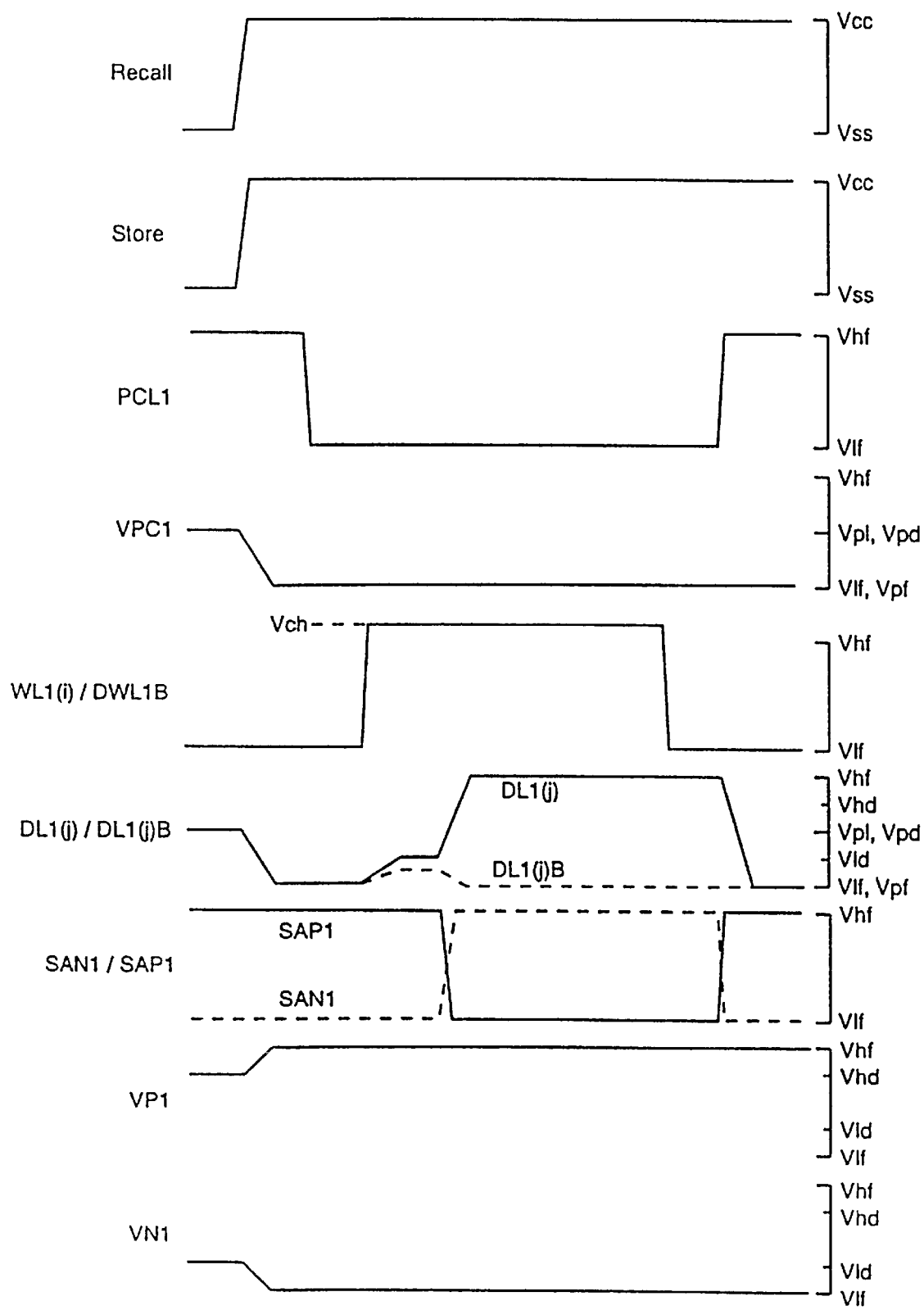
FIG. 20 is a timing chart of the recall operation of this third embodiment.
Figure 21A:
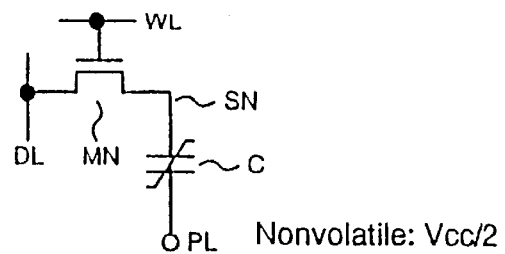
FIG. 21(a) shows a memory cell of a first prior art structure.
Figure 21B:
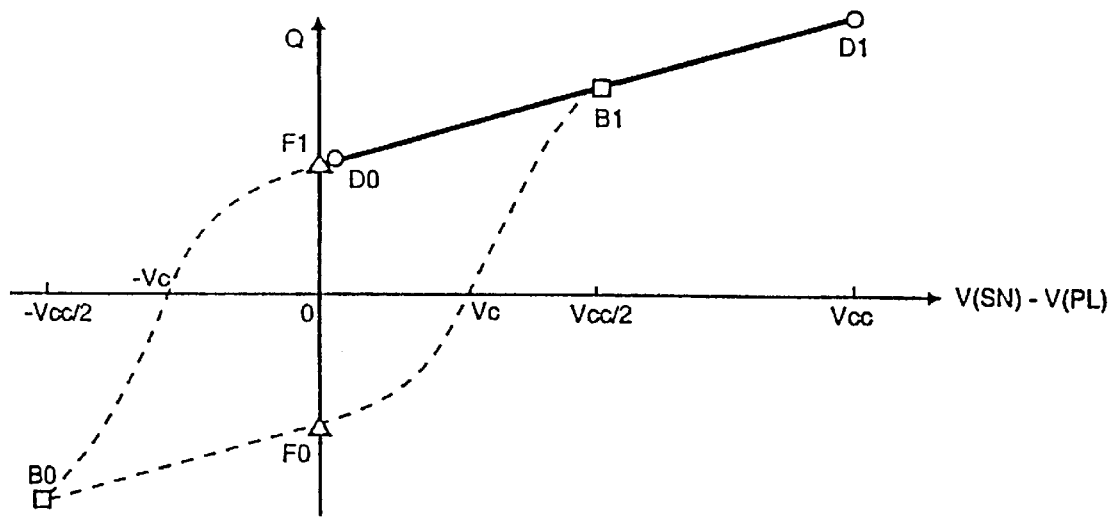
FIG. 21(b) shows a hysteresis loop representing the operation of a ferroelectric capacitor of this first prior art structure.
Figure 22A:
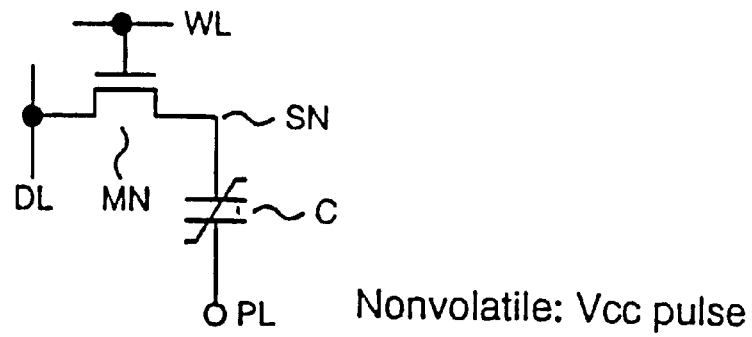
FIG. 22(a) shows a memory cell of a second prior art structure.
Figure 22B:
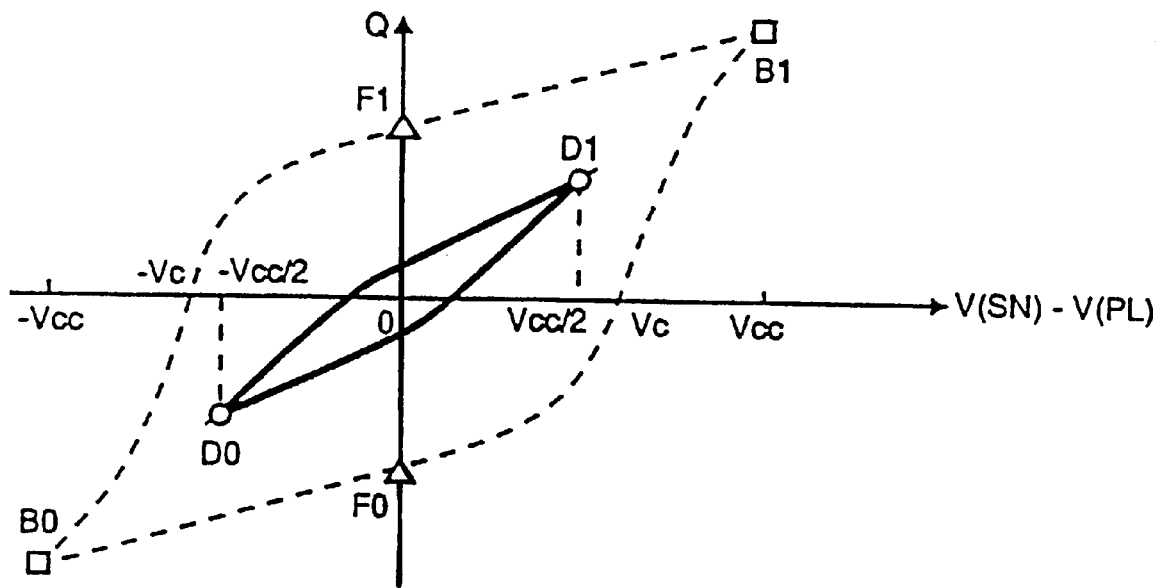
FIG. 22(b) shows a hysteresis loop representing the operation of a ferroelectric capacitor of this second prior art structure.
Figure 23A:
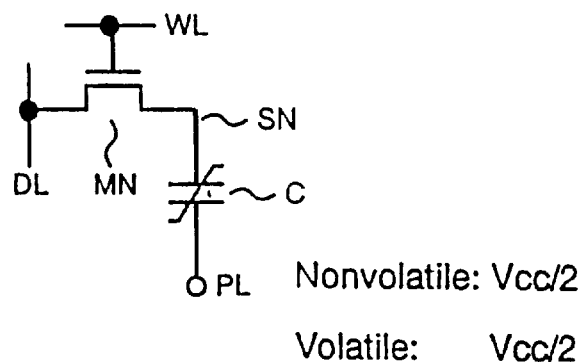
FIG. 23(a) shows a memory cell of a third prior art structure.
Figure 23B:
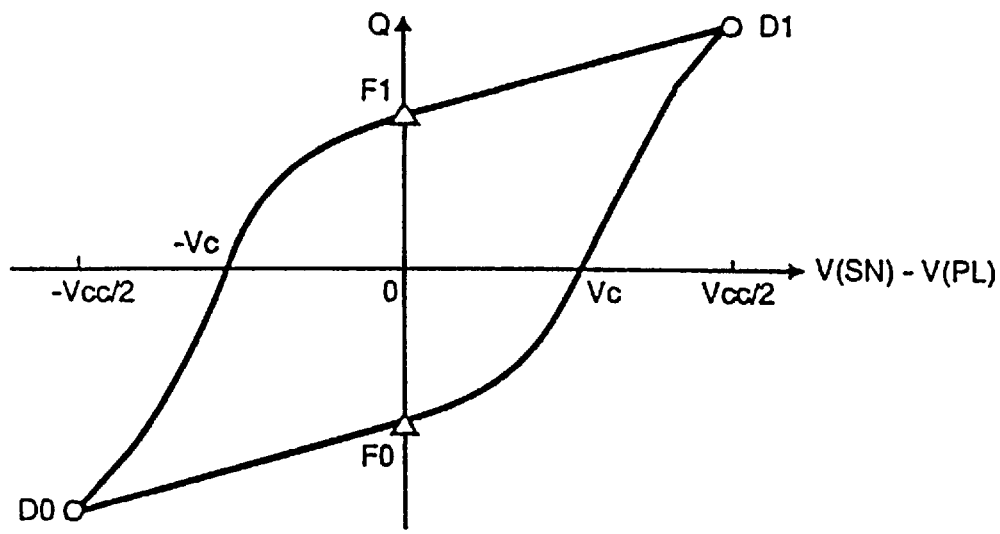
FIG. 23(b) shows a hysteresis loop representing the operation of a ferroelectric capacitor of this third prior art structure.

FIG. 20 shows the recall operation of the ferroelectric memory of this embodiment. In the case of the recall operation of this embodiment, both Recall and Store signals are set to high levels. Thereby, VPCL is set to Vlf, VP1 is set to Vhf, and VN1 is set to Vlf. Then, after a signal is read similarly to the recall operation of embodiment 1, it is amplified by the sense amplifier. In this case, however, the high potential side is amplified up to Vhf and the low potential side is amplified up to Vlf, unlike embodiment 1. Thereby, in FIG. 19(b), the state present at F0 or F1 shifts to B0 or B1.

Finally, SAN1 is driven from Vhf to Vlf and SAP1 is driven from Vlf to Vhf to turn off the sense amplifier, and thereafter, PCL1 is raised to Vhf and the data lines are precharged to Vlf to start the recall operation for the next memory cell. When the recall operation of all bits is ended, the Recall and Store signals are returned to low levels to end the recall operation. Thus, normal memory access is enabled.

In this case, states B0 and B1 have both nonvolatile information and volatile information which coincide with each other. That is, when performing volatile read for state BD, data "1" is read similarly to the state D11. If the power supply is turned off, state B1 shifts to F1. When performing nonvolatile read for state F1, data "1" is read. Whether volatile read or nonvolatile read is performed for state B0, data "0" is read. Therefore, volatile information and nonvolatile information equal to the nonvolatile information when the power supply has been turned off the last time are stored after the recall operation of this embodiment.

Volatile-information read and write operations of this embodiment are the same as those of the first embodiment. However, because the relations |Vld–Vpl|<Vc and |Vhd–Vpl|<Vc hold in these operations, a voltage high enough to reverse polarization is not applied to both ends of the capacitor and the orientation of remanent polarization is not influenced. That is, nonvolatile information is not destroyed due to read or write of volatile information.

Moreover, the refresh operation is performed similarly to that of the first embodiment.

Immediately after the recall operation is performed, nonvolatile information coincides with volatile information. However, when volatile write is continued, some memory cells may have nonvolatile information different from volatile information. That is, they are the cells with the state present at D00 (nonvolatile information is "0" and volatile information is "1") or D10 (nonvolatile information is "1" and volatile information is "0"). These cells have nonvolatile information which is old data when the power supply has been turned off last time and volatile information which is the latest data.

Therefore, this embodiment converts volatile information to nonvolatile information before turning off the power supply to perform the store operation for updating nonvolatile information. The store operation of this embodiment is controlled in the same manner as that of the store operation of the first embodiment.

When volatile information is "0" at the beginning, that is, when the initial state of the ferroelectric capacitor is present at D00 or D10 of FIG. 19(b), the state returns to B0 after the store operation. When volatile information is "1" at the beginning, that is, when the initial state of the capacitor is preset at D01 or D11 of FIG. 19(b), the state returns to B1 after the store operation. As previously described, B0 and B1 have both nonvolatile information and volatile information which coincide with each other. That is, volatile information is converted to nonvolatile information and stored.

Because the time necessary for the store operation is almost equal to the time required to refresh all bits, the store operation can be performed in a short time compared to conventional examples 1 and 2. Therefore, it is possible to not only perform the store operation immediately before turning off the power supply, but also periodically perform it during normal operation. When it is assumed that the power supply is suddenly turned off during use of this memory, volatile data is lost but nonvolatile data for which a store operation has been performed lastly is left. Therefore, lost data is only volatile information rewritten after the last store operation. Therefore, it is possible to further reduce the damage when the power supply is suddenly turned off, by performing the store operation more frequently. However, the store operation causes polarization reversal of a ferroelectric capacitor because the store operation is a nonvolatile write operation. Therefore, the cycle of the store operation is determined considering the life of the ferroelectric capacitor determined by the fatigue. For example, when the limit of the number of capacitor rewritings is $10^9$ times, the life comes to $3 \times 10^8$ sec, or approx. 10 years, by performing the store operation once every 0.3 sec.

The present invention has the following advantages. First, a ferroelectric shadow RAM of the present invention can perform the recall operation and the store operation while the plate potential is fixed. Therefore, these operations are performed at a high speed, and power consumption is reduced. Moreover, the fatigue of the ferroelectric capacitor when performing volatile write decreases and the limit of the number of rewritings increases.

Second, it is possible to store nonvolatile information independent of volatile information; and store a copy of volatile information, at any point of time during volatile operation, as nonvolatile information.

Third, even when a capacitor having a ferroelectric film made of PZT and an electrode made of Pt is used, it is possible to make the most use of a capacitor having a large remanent polarization, by improving the operation method to reduce the fatigue.

While we have shown and described several embodiments in accordance with the present invention, it is understood that the same is not limited thereto, but is susceptible of numerous changes and modifications as known to those skilled in the art. Therefore, we do not wish to be limited to the details shown and described herein, but intend to cover all such changes and modifications as are encompassed by the scope of the appended claims.

We claim:

1. A semiconductor memory comprising a memory cell having a capacitor using a ferroelectric film and a selection transistor, the selection transistor having a gate, a first data line connected to the source or drain of the selection transistor, a second data line, a word line connected to the gate of the selection transistor, an amplifier for amplifying a voltage between the first and second data lines, and a power supply circuit supplying at least a first voltage and a second voltage with an amplitude smaller than that of the first voltage, to the amplifier.

2. The semiconductor memory according to claim 1, wherein the capacitor has a plate electrode connected to a first potential and a storage electrode connected to a drain or source of the selection transistor, the first voltage is generated by a potential difference between a second potential and a third potential, the second voltage is generated by a potential difference between a fourth potential and a fifth potential, and these potentials have the following relation: the second potential<the fourth potential<the first potential<the fifth potential<the third potential.

3. The semiconductor memory according to claim 2, further comprising a circuit to provide a first external power-supply potential and a second external power-supply potential, and a down-converter circuit to generate the third potential by down-converting a voltage of the potential difference between the first external power-supply potential and the second external power-supply potential.

4. The semiconductor memory according to claim 2, further comprising a circuit to provide a first external power-supply potential and a second external power-supply potential, and the third potential is equal to the first external power-supply potential.

5. The semiconductor memory according to claim 2, further comprising a circuit to provide a first external power-supply potential and a second external power-supply potential, and an up-converter circuit to generate the third potential by up-converting a voltage of the potential difference between the first external power-supply potential and the second external power-supply potential, and the fifth potential is equal to the first external power-supply potential.

6. The semiconductor memory according to claim 2, further comprising a circuit to provide a first external power-supply potential and a second external power-supply potential, the second potential is equal to the second external power-supply potential, and a down-converter circuit to generate the fourth potential by down-converting a voltage of the potential difference between the first external power-supply potential and the second external power-supply potential.

7. The semiconductor memory according to claim 2, further comprising a circuit to provide a first external power-supply potential and a second external power-supply potential, and a negative voltage generating circuit to generate the second potential, the first external power-supply potential and the second external power-supply potential being connected to the negative voltage generating circuit, and the fourth potential is equal to the second external power-supply potential.

8. The semiconductor memory according to claim 2, wherein the semiconductor memory further comprises a precharging circuit which precharges the first and second data lines by connecting the data lines to a sixth potential at most equal to the second potential or at least equal to the third potential, immediately before supplying the first voltage to the amplifier, and which precharges the first and second data lines by connecting the data lines to a seventh potential between the fourth potential and the fifth potential immediately before supplying the second voltage to the amplifier.

9. The semiconductor memory according to claim 2, wherein the semiconductor memory further comprises a Y-gate circuit connected to the first and second data lines, an IO line connected to the first and second data lines through the Y-gate circuit, and a write buffer circuit connected to the IO line, and the write buffer circuit outputs the fourth or fifth potential to the IO line in accordance with an information input.

10. The semiconductor memory according to claim 1, wherein the capacitor has a plate electrode connected to a first potential and a storage electrode connected to a drain or source of the selection transistor, the first voltage is generated by a potential difference between a second potential and a third potential, the second voltage is generated by a potential difference between a fourth potential and a fifth potential, and these potentials have the following relation: the second potential<the fourth potential<the fifth potential<the first potential<the third potential, or the second potential<the first potential<the fourth potential<the fifth potential<the third potential.

11. The semiconductor memory according to claim 10, further comprising a circuit to provide a first external power-supply potential and a second external power-supply potential, and a down-converter circuit to generate the third potential by down-converting a voltage of the potential difference between the first external power-supply potential and the second external power-supply potential.

12. The semiconductor memory according to claim 10, further comprising a circuit to provide a first external power-supply potential and a second external power-supply potential, and the third potential is equal to the first external power-supply potential.

13. The semiconductor memory according to claim 10, further comprising a circuit to provide a first external power-supply potential and a second external power-supply potential, and an up-converter circuit to generate the third potential by up-converting a voltage of the potential difference between the first external power-supply potential and the second external power-supply potential, and the fifth potential is equal to the first external power-supply potential.

14. The semiconductor memory according to claim 10, further comprising a circuit to provide a first external power-supply potential and a second external power-supply potential, the second potential is equal to the second external power-supply potential, and a down-converter circuit to generate the fourth potential by down-converting a voltage of the potential difference between the first external power-supply potential and the second external power-supply potential.

15. The semiconductor memory according to claim 10, further comprising a circuit to provide a first external power-supply potential and a second external power-supply potential, and a negative voltage generating circuit to generate the second potential, the first external power-supply potential and the second external power-supply potential being connected to the negative voltage generating circuit, and the fourth potential is equal to the second external power-supply potential.

16. The semiconductor memory according to claim 10, wherein the semiconductor memory further comprises a precharging circuit which precharges the first and second data lines by connecting the data lines to a sixth potential at most equal to the second potential or at least equal to the third potential, immediately before supplying the first voltage to the amplifier, and which precharges the first and second data lines by connecting the data lines to a seventh potential between the fourth potential and the fifth potential immediately before supplying the second voltage to the amplifier.

17. The semiconductor memory according to claim 10, wherein the semiconductor memory further comprises a Y-gate circuit connected to the first and second data lines, an IO line connected to the first and second data lines through the Y-gate circuit, and a write buffer circuit connected to the IO line, and the write buffer circuit outputs the fourth or fifth potential to the IO line in accordance with an information input.

18. The semiconductor memory according to claim 1, wherein the capacitor has a plate electrode connected to a first potential and a storage electrode connected to a drain or source of the selection transistor, the first voltage is generated by a potential difference between a second potential and a third potential, the second voltage is generated by a potential difference between a fourth potential and a fifth potential, and, defining a minimum voltage to be applied to both ends of the capacitor in order to reverse the polarization of the capacitor as a coercive voltage, the above potentials have the following relation: the second potential<the first potential-the coercive voltage<the fourth potential<the first potential<the fifth potential<the first potential+the coercive voltage<the third potential.

19. The semiconductor memory according to claim 18, further comprising a circuit to provide a first external power-supply potential and a second external power-supply potential, and a down-converter circuit to generate the third potential by down-converting a voltage of the potential difference between the first external power-supply potential and the second external power-supply potential.

20. The semiconductor memory according to claim 18, further comprising a circuit to provide a first external power-supply potential and a second external power-supply potential, and the third potential is equal to the first external power-supply potential.

21. The semiconductor memory according to claim 18, further comprising a circuit to provide a first external power-supply potential and a second external power-supply potential, and an up-converter circuit to generate the third potential by up-converting a voltage of the potential difference between the first external power-supply potential and the second external power-supply potential, and the fifth potential is equal to the first external power-supply potential.

22. The semiconductor memory according to claim 18, further comprising a circuit to provide a first external power-supply potential and a second external power-supply potential, the second potential is equal to the second external power-supply potential, and a down-converter circuit to generate the fourth potential by down-converting a voltage of the potential difference between the first external power-supply potential and the second external power-supply potential.

23. The semiconductor memory according to claim 18, further comprising a circuit to provide a first external power-supply potential and a second external power-supply potential, and a negative voltage generating circuit to generate the second potential, the first external power-supply potential and the second external power-supply potential being connected to the negative voltage generating circuit, and the fourth potential is equal to the second external power-supply potential.

24. The semiconductor memory according to claim 18, wherein the semiconductor memory further comprises a precharging circuit which precharges the first and second data lines by connecting the data lines to a sixth potential at most equal to the second potential or at least equal to the third potential, immediately before supplying the first voltage to the amplifier, and which precharges the first and second data lines by connecting the data lines to a seventh potential between the fourth potential and the fifth potential immediately before supplying the second voltage to the amplifier.

25. The semiconductor memory according to claim 18, wherein the semiconductor memory further comprises a Y-gate circuit connected to the first and second data lines, an IO line connected to the first and second data lines through the Y-gate circuit, and a write buffer circuit connected to the IO line, and the write buffer circuit outputs the fourth or fifth potential to the IO line in accordance with an information input.

26. The semiconductor memory according to claim 1, wherein the ferroelectric film includes an insulating film made of PZT and at least one of the electrodes of the capacitor contains Pt.

27. The semiconductor memory according to claim 1, wherein information written in the capacitor by the amplifier to which the first voltage is supplied remains in the ferroelectric film as remanent polarization even if the supply of electric power from outside is stopped.

28. The semiconductor memory according to claim 1, wherein the semiconductor memory comprises one semiconductor chip, and
wherein the memory further comprises a control circuit which reads the information stored in the memory cell by supplying the first voltage or the second voltage to the amplifier immediately after the supply of electric power to the semiconductor chip is started, thereafter changes the voltage to be supplied to the amplifier from the first voltage to the second voltage, or from the second voltage to the first voltage, reads the information stored in the memory cell by supplying the second voltage to the amplifier during volatile operation, and then changes the voltage to be supplied to the amplifier from the second voltage to the first voltage so as to write information in the memory cell as remanent polarization of the ferroelectric film immediately before the supply of electric power to the semiconductor chip is stopped.

29. A semiconductor memory comprising a memory cell having a capacitor using a ferroelectric film and a selection transistor, first and second data lines, an amplifier for amplifying a voltage between the first and second data lines, and a mode switching circuit, responsive to a recall or a store input, to change a power supply voltage to the amplifier and also to change a precharge voltage for each memory cell.

30. The semiconductor memory according to claim 29, wherein the mode switching circuit includes a circuit that changes the precharge voltage such that the memory cell operates in either a volatile mode or a nonvolatile mode.

31. The semiconductor memory according to claim 30, wherein the mode switching circuit includes a circuit that changes a low voltage value from that of a volatile mode of operation of the memory cell to that of a nonvolatile mode of operation of the memory cell, and also includes a circuit that changes a high voltage value from that of a volatile mode of operation of the memory cell to that of a nonvolatile mode of operation of the memory cell.

32. The semiconductor memory according to claim 30, wherein the mode switching circuit includes a circuit that changes low and high voltage levels to the amplifier.

33. The semiconductor memory according to claim 29, wherein the mode switching circuit includes a circuit that changes low and high voltage levels to the amplifier.

34. The semiconductor memory according to claim 29, wherein the mode switching circuit includes a circuit that changes a low voltage value from that of a volatile mode of operation of the memory cell to that of a nonvolatile mode of operation of the memory cell, and also includes a circuit that changes a high voltage value from that of a volatile mode of operation of the memory cell to that of a nonvolatile mode of operation of the memory cell.

35. The semiconductor memory according to claim 29, wherein the mode switching circuit changes the power supply level to the amplifier such that the memory cell can operate in a volatile mode or a nonvolatile mode.

36. The semiconductor memory according to claim 29, further comprising an internal voltage generator generating a plate voltage for the capacitor of the memory cell and at least one voltage for at least one of writing and reading in the memory cell, for at least one of volatile and nonvolatile operation of the memory cell.

37. The semiconductor memory according to claim 36, wherein the internal voltage generator generates voltages for writing and reading in the memory cell, for volatile and nonvolatile operation of the memory cell.

38. The semiconductor memory according to claim 37, wherein the internal voltage generator generates nonvolatile write high and low levels, volatile write high and low levels, and nonvolatile and volatile read precharge levels.

39. The semiconductor memory according to claim 38, wherein the internal voltage generator further generates a word line high level voltage to be applied to a gate of the selection transistor.

40. The semiconductor memory according to claim 36, wherein the internal voltage generator includes at least one of voltage boost and voltage limiter circuits.

41. A semiconductor memory comprising a memory cell having a capacitor using a ferroelectric film and a selection transistor, at least one first data line, and an internal voltage generator, the internal voltage generator including a circuit for supplying a plate voltage to a plate electrode of the capacitor and a circuit for supplying at least one voltage to the data line for at least one of writing and reading in the memory cell, for at least one of volatile and nonvolatile operation of the memory cell.

42. The semiconductor memory according to claim 41, wherein the internal voltage generator includes circuitry for generating voltages for writing and reading in the memory cell, for volatile and nonvolatile operation of the memory cell.

43. The semiconductor memory according to claim 42, wherein the internal voltage generator includes circuitry for generating nonvolatile write high and low levels, volatile write high and low levels, and nonvolatile and volatile read precharge levels.

44. The semiconductor memory according to claim 43, wherein the internal voltage generator further includes circuitry for generating a word line high level voltage, to be applied to a gate of the selection transistor.

45. The semiconductor memory according to claim 41, wherein the internal voltage generator includes at least one of voltage boost and voltage limiter circuits.

* * * * *